US007432529B2

(12) United States Patent
Yamazaki et al.

(10) Patent No.: US 7,432,529 B2
(45) Date of Patent: Oct. 7, 2008

(54) LIGHT EMITTING APPARATUS AND METHOD FOR MANUFACTURING THE SAME

(75) Inventors: Shunpei Yamazaki, Tokyo (JP); Satoshi Murakami, Kanagawa (JP); Masayuki Sakakura, Kanagawa (JP); Toru Takayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 11/142,275

(22) Filed: Jun. 2, 2005

(65) Prior Publication Data
US 2005/0224820 A1    Oct. 13, 2005

Related U.S. Application Data

(62) Division of application No. 10/290,478, filed on Nov. 8, 2002, now Pat. No. 6,903,377.

(30) Foreign Application Priority Data

Nov. 9, 2001 (JP) ............................. 2001-345354
May 17, 2002 (JP) ............................. 2001-143800

(51) Int. Cl.
*H01L 29/04* (2006.01)
(52) U.S. Cl. ............................ 257/72; 257/88
(58) Field of Classification Search ............. 257/72, 257/79, 88; 438/149, 151, 164

See application file for complete search history.

(56) References Cited

U.S. PATENT DOCUMENTS

| 4,717,602 | A | * | 1/1988 | Yamazaki ............. 427/583 |
| 5,550,066 | A | | 8/1996 | Tang et al. |
| 5,701,055 | A | | 12/1997 | Nagayama et al. |
| 5,789,766 | A | | 8/1998 | Huang et al. |
| 5,882,761 | A | | 3/1999 | Kawami et al. |
| 5,929,474 | A | | 7/1999 | Huang et al. |
| 5,952,037 | A | | 9/1999 | Nagayama et al. |
| 5,952,708 | A | | 9/1999 | Yamazaki |
| 5,978,403 | A | | 11/1999 | Iwasa et al. |
| 6,013,538 | A | | 1/2000 | Burrows et al. |
| 6,016,033 | A | | 1/2000 | Jones et al. |
| 6,037,712 | A | | 3/2000 | Codama et al. |
| 6,057,647 | A | | 5/2000 | Kurosawa et al. |
| 6,069,443 | A | | 5/2000 | Jones et al. |

(Continued)

FOREIGN PATENT DOCUMENTS

EP    0 717 439 A2    6/1996

(Continued)

OTHER PUBLICATIONS

Baldo et al., "*Highly Efficient Phosphorescent Emission From Organic Electroluminescent Devices*", Nature, vol. 395, Sep. 10, 1998, pp. 151-154.

(Continued)

*Primary Examiner*—Douglas M Menz
(74) *Attorney, Agent, or Firm*—Nixon Peabody LLP; Jeffrey L. Costellia

(57) ABSTRACT

The purpose of the invention is to improve reliability of a light emitting apparatus comprising a TFT and organic light emitting elements.

31 Claims, 29 Drawing Sheets

U.S. PATENT DOCUMENTS

| | | | |
|---|---|---|---|
| 6,115,090 | A | 9/2000 | Yamazaki |
| 6,169,293 | B1 | 1/2001 | Yamazaki |
| 6,239,470 | B1 | 5/2001 | Yamazaki |
| 6,274,887 | B1 * | 8/2001 | Yamazaki et al. ............. 257/72 |
| 6,297,516 | B1 | 10/2001 | Forrest et al. |
| 6,310,670 | B1 | 10/2001 | Lee |
| 6,331,356 | B1 | 12/2001 | Angelopoulos et al. |
| 6,373,187 | B1 | 4/2002 | Nagayama et al. |
| 6,426,245 | B1 | 7/2002 | Kawasaki et al. |
| 6,441,873 | B2 * | 8/2002 | Young ......................... 349/43 |
| 6,445,005 | B1 | 9/2002 | Yamazaki et al. |
| 6,476,988 | B1 | 11/2002 | Yudasaka |
| 6,501,227 | B1 | 12/2002 | Koyama |
| 6,512,504 | B1 | 1/2003 | Yamauchi et al. |
| 6,538,390 | B2 | 3/2003 | Fujita et al. |
| 6,555,840 | B1 | 4/2003 | Hudson et al. |
| 6,563,554 | B2 | 5/2003 | Okamoto et al. |
| 6,570,639 | B1 | 5/2003 | Manabe et al. |
| 6,590,337 | B1 | 7/2003 | Nishikawa et al. |
| 6,593,990 | B1 | 7/2003 | Yamazaki |
| 6,602,771 | B2 * | 8/2003 | Inoue et al. ................. 438/585 |
| 6,605,826 | B2 | 8/2003 | Yamazaki et al. |
| 6,608,620 | B1 | 8/2003 | Suzuki et al. |
| 6,636,185 | B1 | 10/2003 | Spitzer et al. |
| 6,667,791 | B2 | 12/2003 | Sanford et al. |
| 6,724,150 | B2 | 4/2004 | Maruyama et al. |
| 6,822,264 | B2 | 11/2004 | Yamazaki et al. |
| 6,894,312 | B2 | 5/2005 | Yamazaki et al. |
| 6,903,377 | B2 * | 6/2005 | Yamazaki et al. ............. 257/88 |
| 6,958,740 | B1 | 10/2005 | Nishikawa |
| 6,998,644 | B1 | 2/2006 | Boling et al. |
| 7,030,847 | B2 | 4/2006 | Kimura |
| 7,042,024 | B2 | 5/2006 | Yamazaki et al. |
| 7,126,161 | B2 | 10/2006 | Yamazaki |
| 7,129,523 | B2 | 10/2006 | Yamazaki et al. |
| 7,178,927 | B2 | 2/2007 | Seo |
| 7,190,114 | B2 | 3/2007 | Yamagata et al. |
| 2001/0002144 | A1 | 5/2001 | Yamazaki |
| 2002/0000551 | A1 | 1/2002 | Yamazaki et al. |
| 2002/0056842 | A1 | 5/2002 | Yamazaki |
| 2002/0070663 | A1 | 6/2002 | Ogura et al. |
| 2002/0180371 | A1 | 12/2002 | Yamazaki et al. |
| 2002/0190256 | A1 | 12/2002 | Murakami et al. |
| 2003/0089913 | A1 | 5/2003 | Takayama et al. |
| 2003/0089991 | A1 | 5/2003 | Yamazaki et al. |
| 2003/0155573 | A1 | 8/2003 | Yamazaki et al. |
| 2005/0162092 | A1 | 7/2005 | Yamazaki et al. |
| 2006/0006424 | A1 | 1/2006 | Yamazaki et al. |
| 2007/0012921 | A1 | 1/2007 | Yamazaki |
| 2007/0034875 | A1 | 2/2007 | Yamazaki et al. |

FOREIGN PATENT DOCUMENTS

| | | |
|---|---|---|
| EP | 0 732 868 A1 | 9/1996 |
| EP | 0 776 147 A1 | 5/1997 |
| EP | 1 058 314 A2 | 12/2000 |
| EP | 1 058 484 A1 | 12/2000 |
| JP | 08-241047 | 9/1996 |
| JP | 08-315981 | 11/1996 |
| JP | 10-268360 | 10/1998 |
| JP | 10-321372 | 12/1998 |
| JP | 2000-331784 | 11/2000 |
| JP | 2001-77374 | 3/2001 |

OTHER PUBLICATIONS

Baldo et al. "*Very High-Efficiency Green Organic Light-Emitting Devices Based on Electrophosphorescence*" Applied Physics Letters, vol. 75, No. 1, Jul. 5, 1999, pp. 4-6.

Tsutsui et al., "*Electroluminescence in Organic Thin Films*", Photochemical Processes in Organized Molecular Systems, Sep. 22, 1990, pp. 437-450.

Tsutsui et al., "*High Quantum Efficiency in Organic Light-Emitting Devices With Iridium-Complex as a Triplet Emissive Center*", Japanese Applied Physics, vol. 38, Dec. 15, 1999, pp. L1502-L1504.

\* cited by examiner

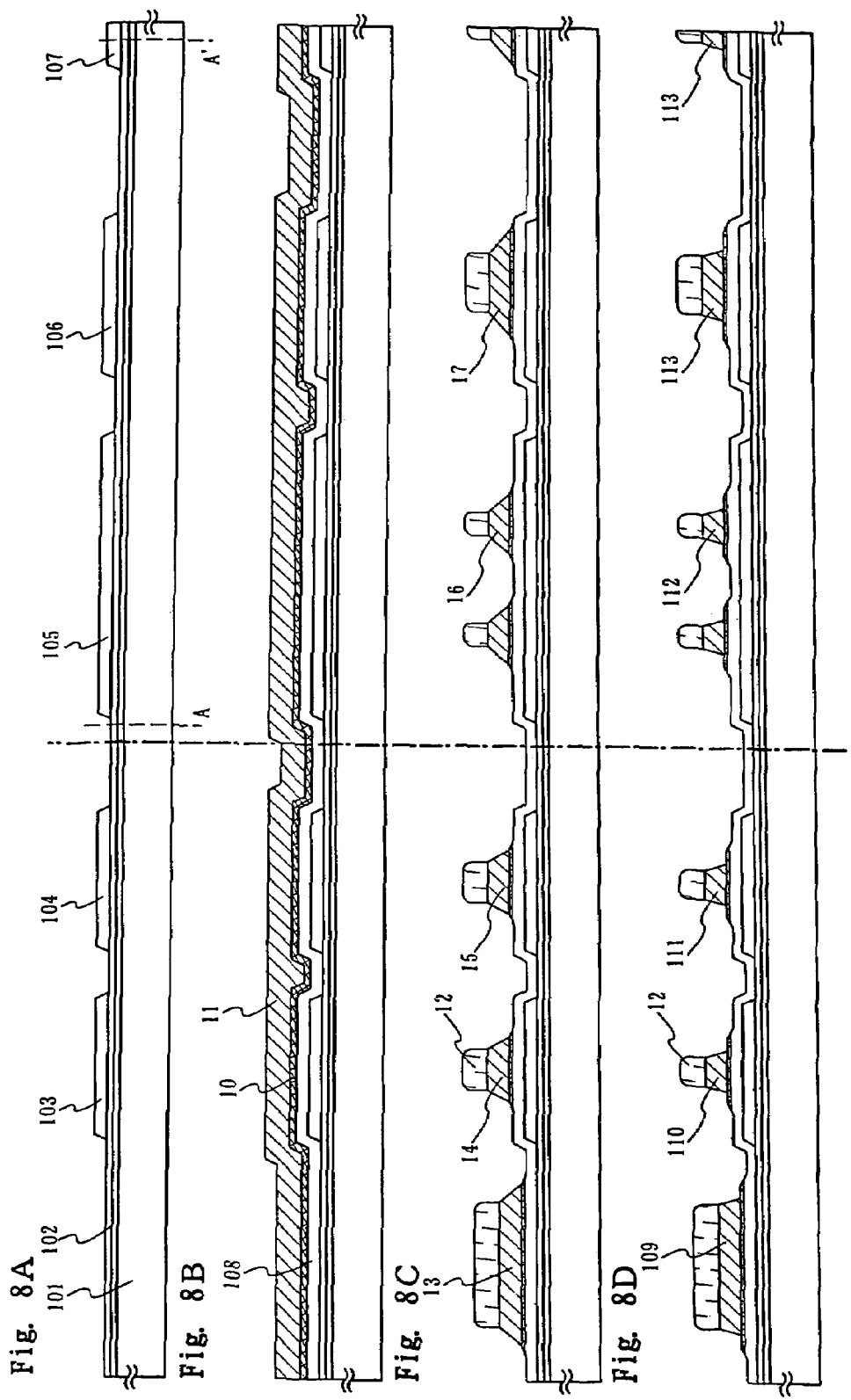

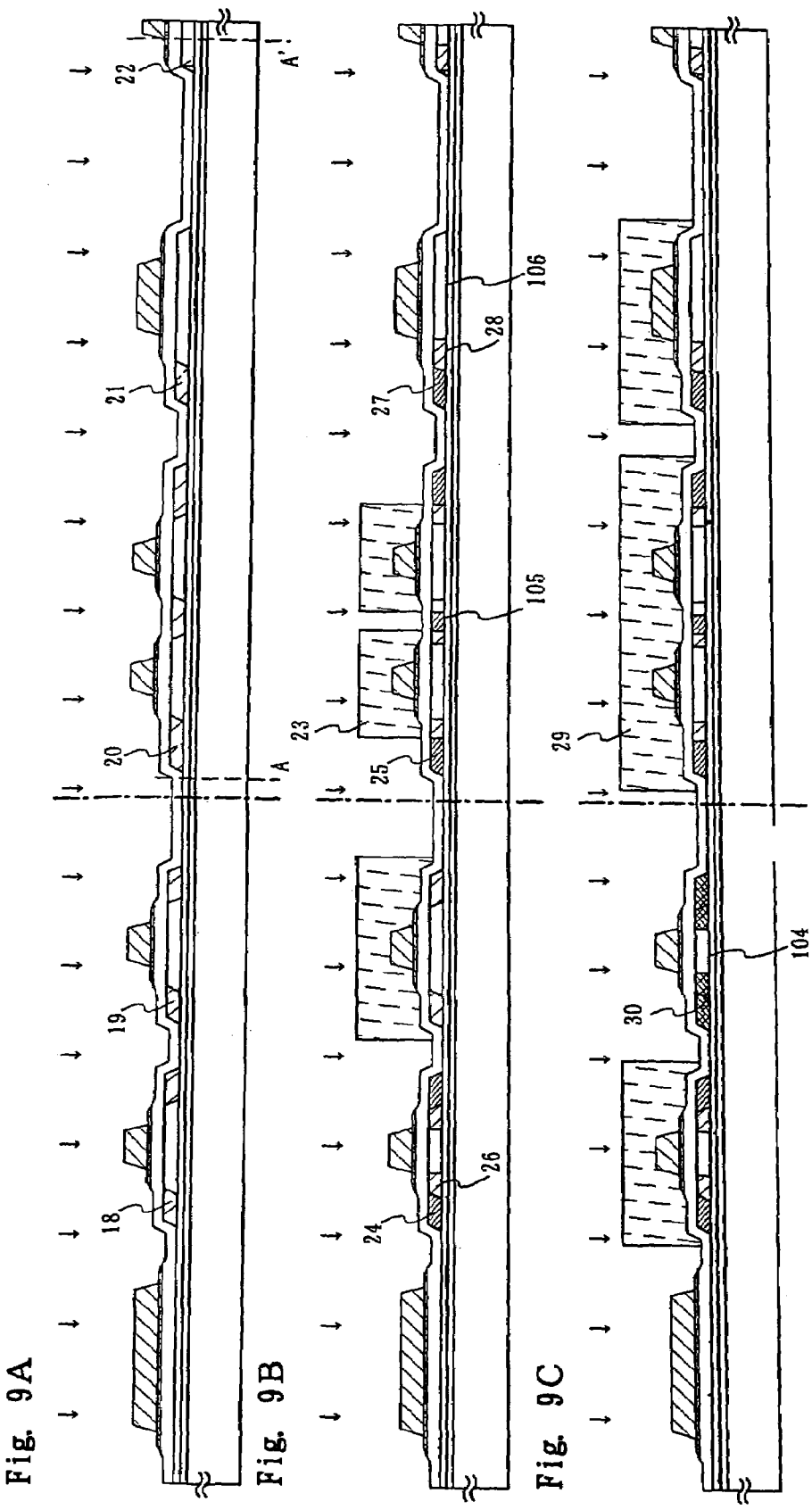

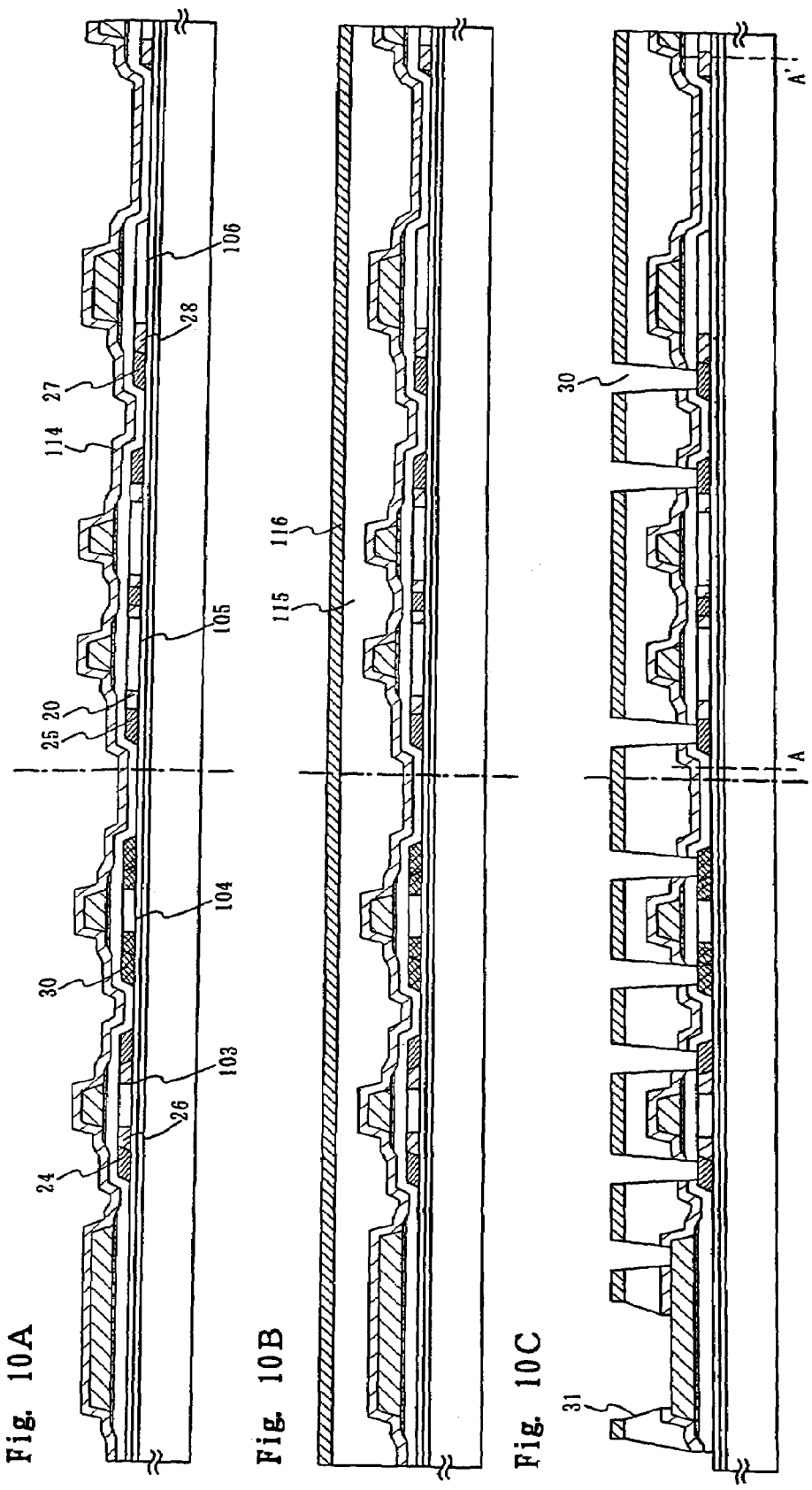

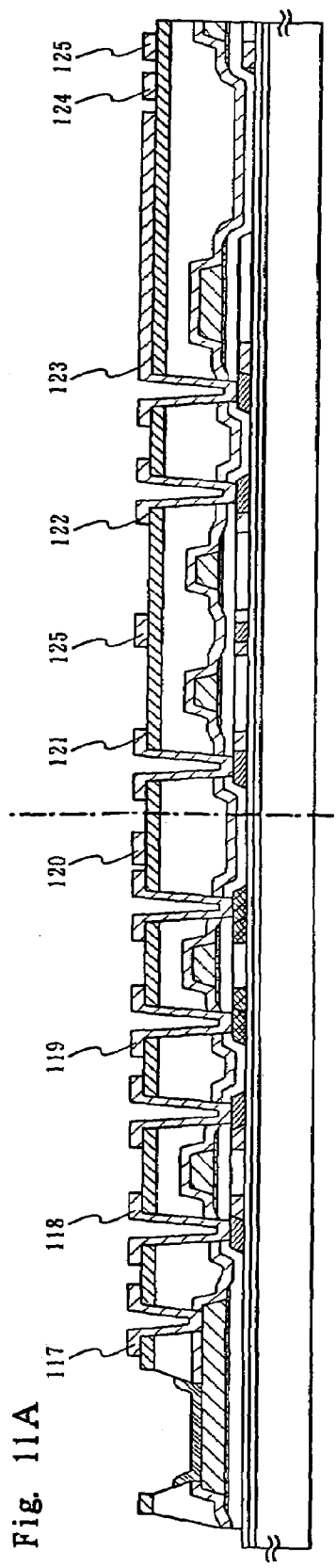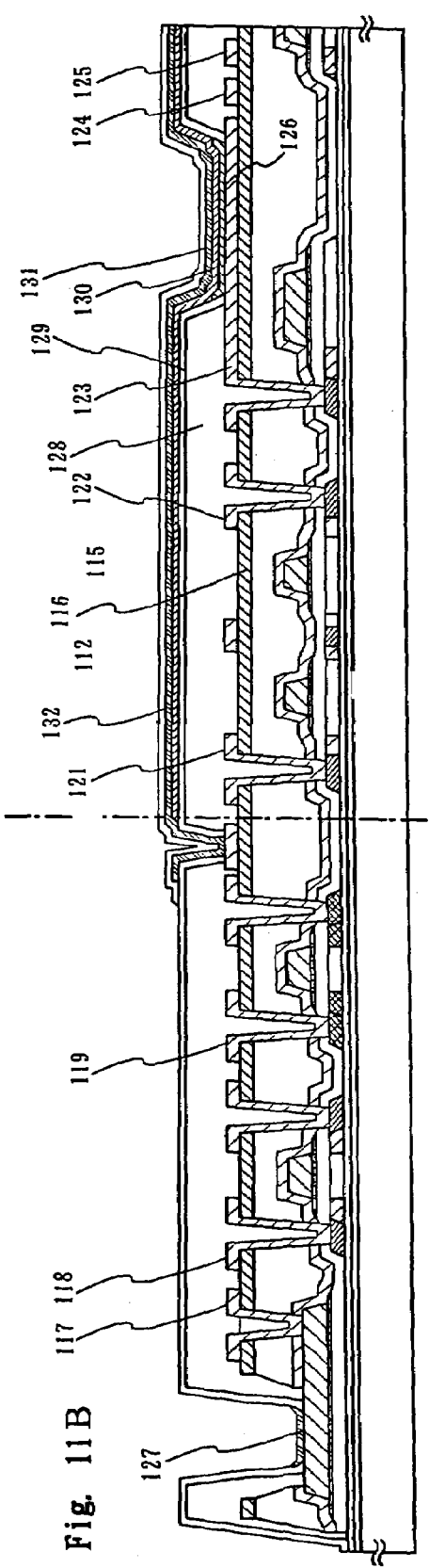
Fig. 11A
Fig. 11B

※sputtering condition refers to Table. 1

C-V characteristics of MOS structure in case that there is a source of Li diffusion BT stress test condition:
150°C, 1.7MV/cm
1 hr

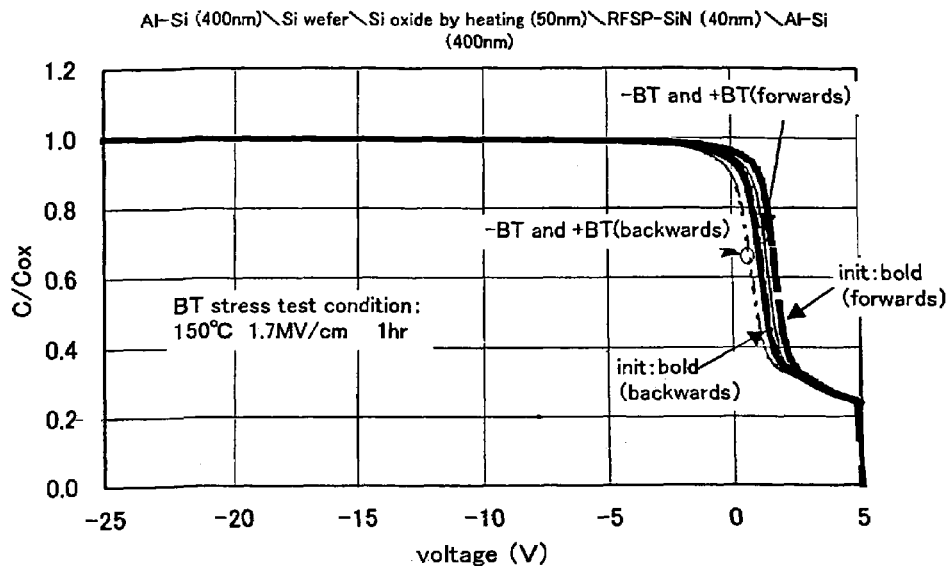
Fig. 28A C-V characteristics of MOS structure in case that there is not a source of Li diffusion
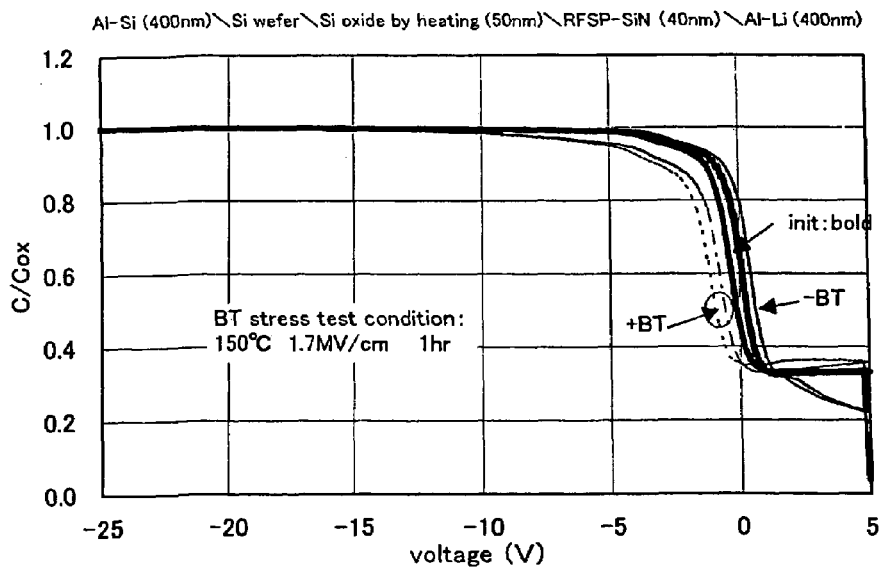
Fig. 28B C-V characteristics of MOS structure in case that there is not a source of Li diffusion

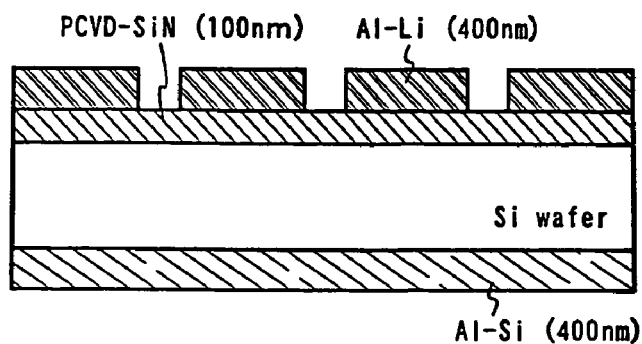
Fig. 29A MOS structure comprising PCVD-SiN film
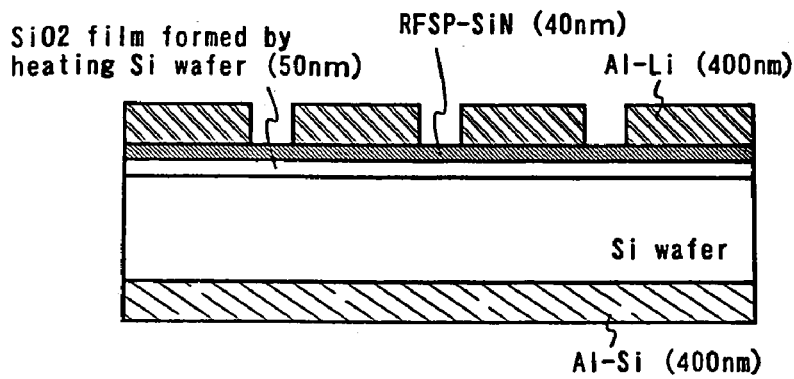
Fig. 29B MOS structure comprising RFSP-SiN film

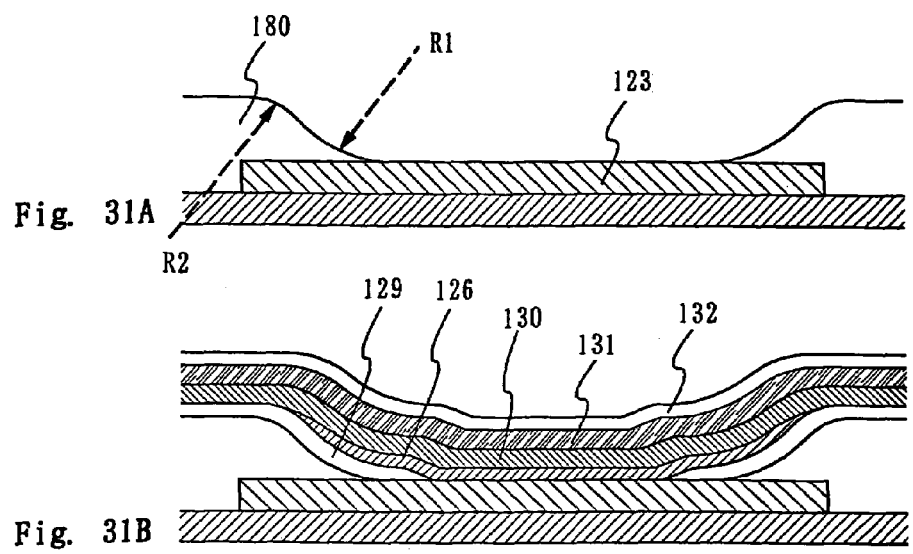
Fig. 31A
Fig. 31B
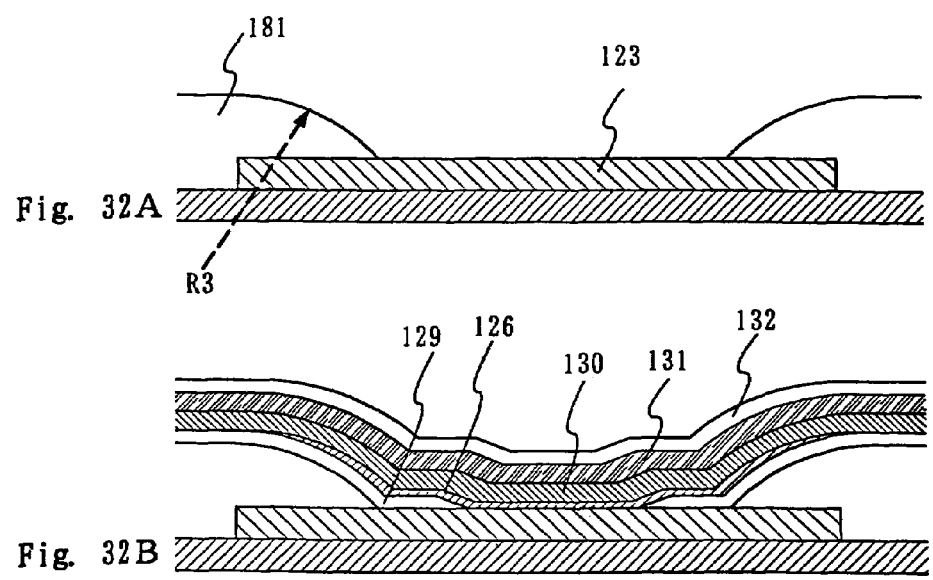
Fig. 32A
Fig. 32B

LIGHT EMITTING APPARATUS AND METHOD FOR MANUFACTURING THE SAME

BACKGROUND OF THE INVENTION

1. Field of the Invention

The present invention relates to a light emitting apparatus comprising a light emitting element which emit fluorescent light or phosphorescent light. In particular, the invention relates to a light emitting apparatus comprising an active element such as insulation gate type transistor or a thin film transistor, and a light emitting element coupled thereto.

2. Description of the Related Art

A typical display apparatus utilizing liquid crystal uses a back light or a front light for displaying images. A liquid crystal display apparatus is employed as an image displaying unit in various electronics, but suffers a problem that it has a narrow angled field of view. On the contrary, a display which uses light emitting elements providing electro-luminescence as a display unit has a wider angled field of view as well as high level of visual recognition. These advantages make the electro-luminescent display prospective for the next generation.

In a light emitting element utilizing the electro-luminescence, electrons injected from a cathode and positive holes injected from an anode couple on a layer comprising light emitting material to form excitons. Light is generated by the energy released when the excitons move back to the ground state. There are two types of electro-luminescence, i.e., fluorescent light and phosphorescent light, each which are considered as light emitted from the excitons in a singlet state (fluorescent light), and light emitted from the excitons in a triplet state (phosphorescent light), respectively. The luminance from electro-luminescence ranges from thousands $cd/m^2$ to tens of thousands $cd/m^2$, which makes it possible in principle to adopt the electro-luminescence light emitting elements in a variety of applications including a display apparatus.

An example of a combination of a thin-film transistor (hereinafter referred to as "TFT") and a light emitting element is disclosed in the Japanese Patent Laid-Open No. JP-A-8-241047. In the construction disclosed in this JP-A-8-241047, an organic electro-luminescence layer is formed over a TFT comprising polycrystalline silicon, via an insulation film comprising silicon dioxide. A passivasion layer having a tapered end on the anode is positioned under the organic electro-luminescence layer. The cathode is made from a material with a work function of 4 eV or less. An example of an applicable material is an alloy of metal such as silver or aluminum, and magnesium.

Problem to be Solved

Known methods for manufacturing the organic electro-luminescence layer include vacuum evaporation, printing, and spin coating. However, it is difficult to form determined patterns on the organic electro-luminescence layer by photolithography technique as used in the semiconductor element manufacturing. In order to arrange the light emitting elements in a matrix to make a display screen, a special construction is necessary in which each pixel is partitioned with insulation material, as disclosed in the above JP-A-8-241047.

In the first place, an organic compound used for the light emitting elements, and an alkali metal or an alkali earth metal used for an electrode are degraded by reactions with water and oxygen. This prevents practical application of the light emitting apparatus comprising the light emitting elements.

The organic light emitting element deteriorates due to following six factors; (1) change in the chemical characteristics of the organic compound (2) change in the structure, or deterioration by fusion, of the organic compounds by heat generated at operating, (3) destruction of insulation due to macro-level defect, (4) deterioration of the interface between the electrodes, or the electrode and the organic compound layer comprising the light emitting element, (5) deterioration caused by the change in bonding state or crystallization of the organic compound due to amorphous form, and (6) irreversible destruction caused by stress or distortion due to the structure of the elements.

The deterioration by the factor (1) is caused by chemical change incurred by excitation, or gas which is corrosive against the organic compounds or moisture. The deterioration by the factor (2) and (3) is caused by the operation of the organic light emitting element. Heat is inevitably generated when current in the element is converted into Joule heat. When the organic compound has low melting point or glass transition temperature, the electric field concentrate around pinholes or cracks and dielectric breakdowns occur. The deterioration by the factors (4) and (5) is inevitable even when the element is stored at ambient temperature. The deterioration by the factor (4) is known as dark spots, which are generated by the oxidation of the cathode or the reaction to moisture. For deterioration by the factor (5), all the organic compounds used in the organic light emitting element are amorphous, so that they will be inevitably crystallized in a long period by heat for example. Almost no organic compound can keep its amorphous structure for a long time. For deterioration by the factor (6), a defect such as a crack or a break of the coating due to distortion may develop by the difference in thermal expansion coefficient between components. Furthermore, the crack or the break may lead to a progressive defect such as dark spots.

The advance in sealing techniques has fairly mitigated the problem of dark spots. However in practice, the deterioration is caused by two or more of the above factors, which makes it difficult to take effective preventive measure. In typical sealing method, the organic light emitting element formed over a substrate is sealed with sealant, and drying agent such as barium oxide is applied in the spaces. Unfortunately, conventional preventive measures have failed to suppress the deterioration of the light emitting apparatus to an acceptable level.

SUMMARY OF THE INVENTION

The purpose of the present invention is to solve the above problems in order to improve the reliability of a light emitting apparatus comprising TFTs and organic light emitting elements.

For this purpose, according to the present invention, a light emitting apparatus with pixels consisting of electrically connected TFTs and light emitting elements has a construction wherein the light emitting elements are formed by laminating an anode layer, a cathode layer, and an interposed layer containing light emitting material, surrounding the upper surface, the lower surface and the side surface of the light emitting element with an inorganic insulation layer, and the anode layer, the cathode layer and the layer containing light emitting material respectively contact with the surrounding inorganic insulation layer. The inorganic insulation layer is formed of silicon nitride or oxynitride of silicon such as a silicon nitride film or a silicon oxynitride film, or, nitride or oxynitride of aluminum such as aluminum nitride or aluminum oxynitride. More preferably, the silicon nitride film formed by radio frequency sputtering (RF sputtering) with frequency ranging from 13.56 MHz to 120 MHz and having silicon as a target is applied.

The silicon nitride film manufactured by the RF sputtering has improved effect of blocking the external impurities and an effect of suppressing the deterioration of the light emitting element by satisfying one of the following conditions; (1) a silicon nitride film with etching rate of 9 nm/min or less (preferably, 0.5 to 3.5 nm/min or less), (2) hydrogen concentration of $1\times10^{21}$ atoms/cm$^{-3}$ or less (preferably $5\times10^{20}$ atoms/cm$^3$ or less), (3) hydrogen concentration of $1\times10^{21}$ atoms/cm$^3$ or less (preferably $5\times10^{20}$ atoms/cm$^3$ or less), and oxygen concentration from $5\times10^{18}$ to $5\times10^{21}$ atoms/cm$^3$ (preferably $1\times10^{19}$ to $1\times10^{21}$ atoms/cm$^3$), (4) etching rate of 9 nm/min or less (preferably, 0.5 to 3.5 nm/min or less), and hydrogen concentration of $1\times10^{21}$ atoms/cm$^3$ or less (preferably $5\times10^{20}$ atoms/cm$^3$ or less), or (5) etching rate of 9 nm/min or less (preferably, 0.5 to 3.5 nm/min or less), hydrogen concentration of $1\times10^{21}$ atoms/cm$^3$ or less (preferably $5\times10^{20}$ atoms/cm$^3$ or less), and oxygen concentration from $5\times10^{18}$ to $5\times10^{21}$ atoms/cm$^3$ (preferably $1\times10^{19}$ to $1\times10^{21}$ atoms/cm$^3$).

In a construction wherein a display screen has light emitting elements arranged in matrix, the most preferable construction of an insulation layer to partition the each pixel comprises a positive-type or a negative-type photosensitive organic resin material and has a curvature radius of 0.2 to 2 μm or continuously varying curvature radiuses within the above range at the end of the patterns, and a tapered surface with an inclination angle from 10 to 75 degrees, preferably from 35 to 45 degrees. The construction of a pixel in the light emitting apparatus according to the invention can mitigate the stress on the electrode ends of the pixel and suppress the deterioration of the light emitting element, by forming an insulation layer which covers ends of the individual electrode (either anode or cathode) of each pixel connecting to the TFT to partition each pixel, and by forming a layer containing the light emitting material, and one of the anode layer or the cathode layer, from over the pixel electrode to over the insulation layer.

The construction of a light emitting apparatus according to the invention will be described below.

A light emitting apparatus comprising a TFT having a semiconductor layer, a gate insulation film and a gate electrode, and a light emitting element having an organic compound layer containing light emitting material between a cathode layer and an anode layer, comprises, a first inorganic insulation layer under the semiconductor layer, a second inorganic insulation layer on the gate electrode, a first organic insulation layer on the second inorganic insulation layer, a third inorganic insulation layer on the first organic insulation layer, a wiring layer extending on the third inorganic insulation layer, a second organic insulation layer overlapping with the end of the wiring layer, the second organic insulation layer having an inclination angle of 35 to 45 degrees, a fourth inorganic insulation layer formed on the upper surface and the side surface of the second organic insulation layer, the fourth inorganic insulation layer having an opening over the wiring layer, a cathode layer formed in contact with the wiring layer and having an end overlapping with the fourth inorganic insulation layer, an organic compound layer formed in contact with the cathode layer and the fourth inorganic insulation layer, the organic compound layer containing the light emitting material, and an anode layer formed in contact with the organic compound layer containing the light emitting material, wherein;

the third inorganic insulation layer and the fourth inorganic insulation layer comprise silicon nitride or aluminum nitride.

A light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed from a thin film transistor having a semiconductor layer, a gate insulation film and a gate electrode, the driving circuit section being formed in the peripheral region of the pixel section, comprises;

a first inorganic insulation layer under the semiconductor layer, a second inorganic insulation layer on the gate electrode, a first organic insulation layer on the second inorganic insulation layer, a third inorganic insulation layer on the first organic insulation layer, a wiring layer extending on the third inorganic insulation layer, a second organic insulation layer overlapping with the end of the wiring layer, the second organic insulation layer having an inclination angle of 35 to 45 degrees, a fourth inorganic insulation layer formed on the upper surface and the side surface of the second organic insulation layer, the fourth inorganic insulation layer having an opening over the wiring layer, a cathode layer formed in contact with the wiring layer, the cathode layer having an end overlapping with the fourth inorganic insulation layer, an organic compound layer formed in contact with the cathode layer and the fourth inorganic insulation layer, the organic compound layer containing the light emitting material, and, an anode layer formed in contact with the organic compound layer containing the light emitting material, wherein;

the third inorganic insulation layer and the fourth inorganic insulation layer comprise silicon nitride or aluminum nitride, seal patterns are formed on the fourth inorganic insulation layer, and some or all of the seal patterns overlap with the driving circuit section.

The cathode layer may have the fifth inorganic insulation layer thereon, which is formed of nitride of silicon or aluminum.

The third to the fifth inorganic insulation layers have the above mentioned etching characteristics, and hydrogen concentration and oxygen concentration in the above range. By reducing the density of N—H bond, Si—H bond and the Si—O bond, the construction according to the invention can improve thermal stability of a film and make a fine film.

A light emitting apparatus comprising a pixel section having a TFT having a semiconductor layer, a gate insulation film and agate electrode, and a light emitting element including an organic compound layer containing light emitting material between an anode layer and a cathode layer, and a driving circuit section formed from a TFT having a semiconductor layer, a gate insulation film and a gate electrode, the driving circuit section being formed in the peripheral region of the pixel section, wherein;

a barrier layer formed from an organic insulation layer on the pixel section extends over the driving circuit section, an inorganic insulation layer comprising silicon nitride or aluminum nitride is formed on the upper surface and the side surface of the barrier layer, seal patterns are formed on the inorganic insulation layer, some or all of the seal patterns overlap with the driving circuit section, and a connection between the anode layer and the wiring formed under the anode layer is provided inside of the seal patterns.

A light emitting apparatus comprising a pixel section having a first TFT having a semiconductor layer, a gate insulation film and a gate electrode, and a light emitting element including an organic compound layer containing light emitting material between an anode layer and a cathode layer, and a driving circuit section formed from a second TFT having a semiconductor layer, a gate insulation film and a gate electrode, the driving circuit section being formed in the peripheral region of the pixel section, wherein;

a barrier layer formed from an organic insulation layer on the pixel section extends over the driving circuit section, an inorganic insulation layer comprising silicon nitride or aluminum nitride is formed on the upper surface and the side surface of the barrier layer, seal patterns are formed on the inorganic insulation layer, the first TFT is formed inside of the seal patterns, all or some of the second TFT overlap with the seal patterns, and, a connection between the anode layer and the wiring formed under the anode layer is provided inside of the seal patterns.

The inorganic insulation layer comprises silicon nitride manufactured by the RF sputtering method, and has the above mentioned etching characteristics, and hydrogen concentration and oxygen concentration in the above range.

The another aspect of the invention provides a method to manufacture a light emitting apparatus, as described below.

A method for manufacturing a light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed from a thin film transistor having a semiconductor layer, a gate insulation film and a gate electrode, the driving circuit section being formed in the peripheral region of the pixel section, comprises steps of;

forming a first inorganic insulation layer on a substrate, forming a semiconductor layer comprising crystalline silicon on the first inorganic insulation layer, forming a gate insulation film on the semiconductor layer and a gate electrode on the gate insulation film, forming a second inorganic insulation layer on the gate electrode, forming a first organic insulation layer on the second inorganic insulation layer, forming a third inorganic insulation layer on the second organic insulation layer, forming a wiring layer in contact with the third inorganic insulation layer, forming a second organic insulation layer overlapping with the end of the wiring layer, the second organic insulation layer having an inclination angle of 35 to 45 degrees, forming a fourth inorganic insulation layer on the upper surface and side surface of the second organic insulation layer, the fourth inorganic insulation layer having an opening over the wiring layer, forming a cathode layer in contact with the wiring layer, the cathode layer having an end overlapping with the fourth insulation layer, forming an organic compound layer containing the light emitting material in contact with the cathode layer and the fourth inorganic insulation layer, and, forming an anode layer in contact with the organic compound layer containing the light emitting material, wherein, the third inorganic insulation layer and the fourth inorganic insulation layer comprise silicon nitride or aluminum nitride formed by RF sputtering method.

A method for manufacturing a light emitting apparatus comprising a pixel section having a TFT having a semiconductor layer, a gate insulation film and a gate electrode, and a light emitting element including an organic compound layer containing light emitting material between an anode layer and a cathode layer, and a driving circuit section formed from a TFT having a semiconductor layer, a gate insulation film and a gate electrode, the driving circuit section being formed in the peripheral region of the pixel section, comprises steps of;

forming a first inorganic insulation layer on a substrate, forming a semiconductor layer comprising crystalline silicon on the first inorganic insulation layer, forming a gate insulation film on the semiconductor layer and a gate electrode on the gate insulation film, forming a second inorganic insulation layer on the gate electrode, forming a first organic insulation layer on the second inorganic insulation layer, forming a third inorganic insulation layer on the second organic insulation layer, forming a wiring layer in contact with the third inorganic insulation layer, forming a second organic insulation layer overlapping with the end of the wiring layer, the second organic insulation layer having an inclination angle of 35 to 45 degrees, forming a fourth inorganic insulation layer on the upper surface and side surface of the second organic insulation layer, the fourth inorganic insulation layer having an opening over the wiring layer, forming a cathode layer in contact with the wiring layer, the cathode layer having an end overlapping with the fourth insulation layer, forming an organic compound layer containing the light emitting material formed in contact with the cathode layer and the fourth inorganic insulation layer, forming an anode layer in contact with the organic compound layer containing the light emitting material, forming seal patterns on the fourth insulation layer at a position in which some or all of the seal patterns overlap with the driving circuit section, and, adhering a sealing plate in alignment with the seal patterns, wherein, the third inorganic insulation layer and the fourth inorganic insulation layer comprise silicon nitride or aluminum nitride formed by RF sputtering method.

In the above construction according to the invention, the third and the fourth inorganic insulation layers comprise silicon nitride by the RF sputtering method using only nitrogen as sputtering gas and having silicon as a target. The third inorganic insulation layer is formed after formation of the first organic insulation layer, by heating and dehydrating under reduced pressure, while the reduced pressure is maintained.

The fourth inorganic insulation layer is formed after formation of the second organic insulation layer, by heating and dehydrating under reduced pressure, while the reduced pressure is maintained.

The light emitting apparatus herein refers to the apparatus which uses electro-luminescence for emitting light, in general. The light emitting apparatus includes a TFT substrate in which circuitry is formed from TFT on a substrate for light emission, an EL panel which incorporates the light emitting elements formed with electro-luminescence material on a TFT substrate, and an EL module which incorporates external circuitry into an EL panel. The light emitting apparatus according to the invention can be incorporated in a variety of electronics such as a mobile telephone, a personal computer and a television receiver.

BRIEF DESCRIPTION OF THE DRAWING

FIGS. 8A to 8D are cross-sectional views which illustrate manufacturing processes of the light emitting apparatus according to the invention.

FIGS. 9A to 9C are cross-sectional views which illustrate manufacturing processes of the light emitting apparatus according to the invention.

FIGS. 10A to 10C are cross-sectional views which illustrate manufacturing processes of the light emitting apparatus according to the invention.

FIGS. 11A and 11B are cross-sectional views which illustrate manufacturing processes of the light emitting apparatus according to the invention.

FIGS. 28A and 28B are graphs which show the C-V characteristics before and after the BT stress test of the MOS construction.

FIGS. 29A and 29B are views which illustrate the MOS construction.

FIGS. 31A and 31B are cross-sectional views which illustrate the construction of the pixel section of the light emitting apparatus according to the invention.

FIGS. 32A and 32B are cross-sectional views which illustrate the construction of the pixel section of the light emitting apparatus according to the invention.

DESCRIPTION OF THE PREFERRED EMBODIMENT

Figure 1:
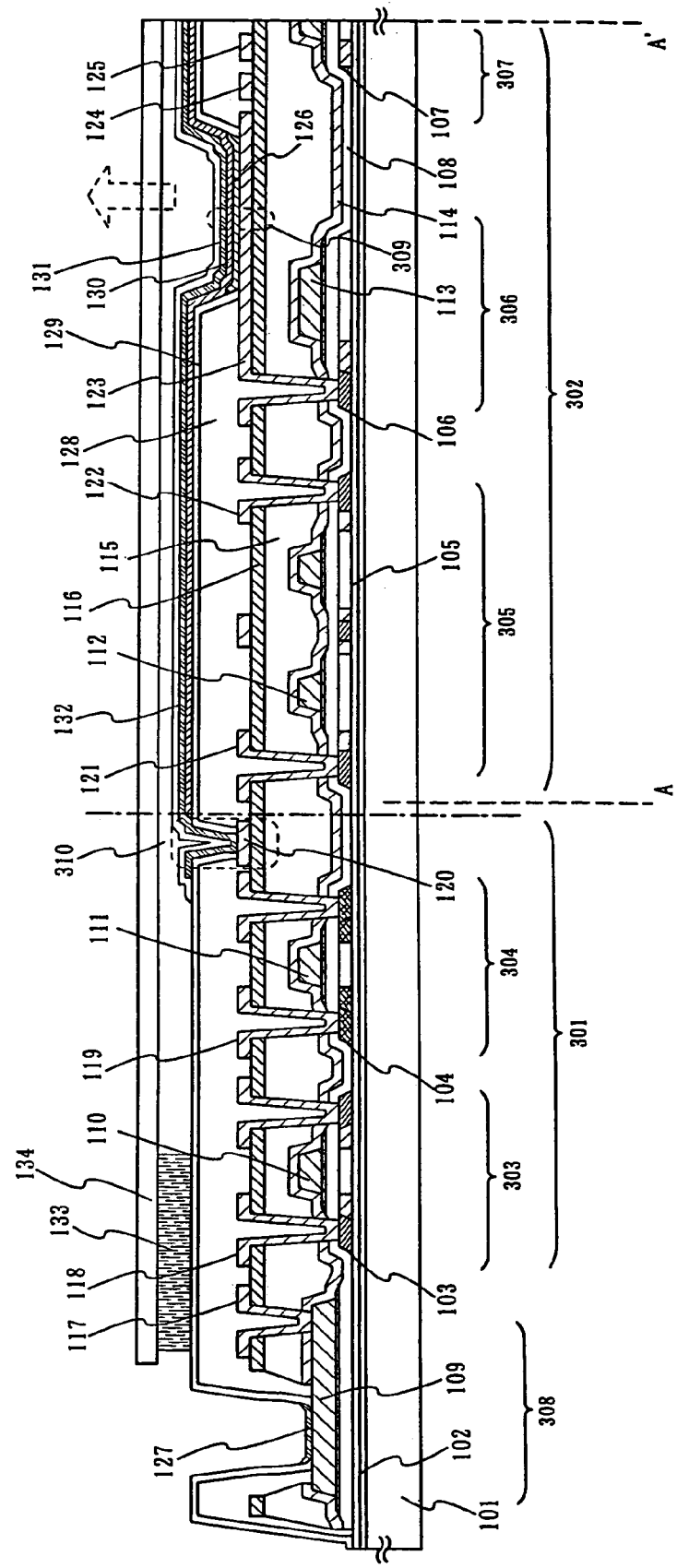
FIG. 1 is a cross-sectional view which illustrates the construction of the light emitting apparatus according to the invention.

The embodiments of the invention will be described with reference to the accompanied drawings. Common components among several drawings have same reference numerals.

FIG. 1 shows a construction of a light emitting apparatus of an active matrix driving method according to the present invention. The TFTs are provided in a pixel section 302 and a driving circuit section 301 formed around the pixel section 302. Either amorphous silicon, polysilicon, or single crystal silicon is applicable for the semiconductor layer which forms the channel forming region of the TFT. For switching purpose, the TFT may be formed with organic semiconductor.

The substrate 101 comprises a glass substrate or an organic resin substrate. The organic resin has lighter weight than the glass, which is advantageous to reduce the weight of the light emitting apparatus as a whole. Organic resin such as polyimide, polyethylene terephthalate (PET), polyethylene naphthalate (PEN), polyether sulfone (PES), and aramid is applicable to manufacture the light emitting apparatus. Borosilicate glass which is known as no-alkali glass containing less amount of alkali metal element is preferred to be used as a glass substrate. The thickness of the glass substrate may be 0.5 to 1.1 mm, however, if it is necessary to reduce the weight of the apparatus, the thickness should be reduced. It is desirable to employ a glass material with small specific density such as 2.37 g/cm$^3$ to furthermore reduce the weight.

In the construction shown in FIG. 1, a n-channel type TFT 303 and a p-channel type TFT 304 are formed in the driving circuit section 301, and a first TFT 305 and a fourth TFT 306 formed with n-channel type TFT are formed in the pixel section 302. The fourth TFT 306 connects to a cathode 126 of a light emitting element 309.

These TFT comprises semiconductor layers 103 to 106, a gate insulation film 108, and gate electrodes 110 to 113 on a first inorganic insulation layer 102 formed of silicon nitride or silicon oxynitride. A second inorganic insulation layer 114 formed of silicon nitride or silicon oxynitride containing hydrogen is formed on the gate electrode. The second inorganic insulation layer in combination with the first inorganic insulation layer 102 serves as a protective film which prevents contamination of the semiconductor layers caused by diffusion of impurities such as moisture or metal into the semiconductor layer.

A first organic insulation layer 115 of 0.5 to 1 μm thickness formed of one of polyimid, polyamide, polyimidamide, acrylic, BCB (benzocyclobutene) is formed as a planarizing layer on the second inorganic insulation layer 114. The first organic insulation layer 115 is formed by spin coating one of the above organic compounds, then applying calcination. The organic insulation material is hygroscopic and absorbs and occludes moisture. When the occluded moisture is released, oxygen is supplied to the organic compounds included in the light emitting element formed over the organic insulation layer, which deteriorates the organic light emitting element. To prevent the occlusion and the release of moisture, a third inorganic insulation layer 116 of 50 to 200 nm thickness is formed on the first organic insulation layer 115. The third inorganic insulation layer 116 must be a fine film in order to adhere to the underlining layer more securely to provide barrier. The layer 116 is formed preferably by the sputtering of an inorganic insulation material selected from silicon nitride, silicon oxynitride, aluminum oxynitride and aluminum nitride. Wirings 117 to 125 are formed after the formation of the third inorganic insulation layer 116.

The light emitting element 309 is formed on an anode layer 131, the cathode layer 126 comprising alkali metal or alkali earth metal, and an interposing organic compound layer 130 containing a light emitting material. The organic compound layer 130 containing the light emitting material is formed by laminating one or more layers. Each layer is named according to its purpose and function; a positive hole injection layer, a positive hole transferring layer, a light emitting layer, an electrons transferring layer and an electrons injection layer. These layers can be formed of low molecular weight organic compounds, middle molecular weight organic compounds, high molecular weight organic compounds, or combination of two of the above compounds appropriately. Also, a mixed layer comprising mixture of the electron transferring material and the positive hole transferring material, or a mixed connection forming mixed region between the interface of them can be made.

This organic light emitting element 309 is formed on the third inorganic insulation layer 116. The light emitting apparatus having a construction to emit light in the direction opposite to the substrate 101 causes the cathode layer 126 of the light emitting element 309 to contact to the wiring 123 formed on the third inorganic insulation layer 116. The cathode layer 126 is formed of an alkali metal or an alkali earth metal having smaller work function, such as magnesium (Mg), lithium (Li) or calcium (Ca). Preferably, an electrode comprising MgAg (a mixture of Mg and Ag with ratio of 10:1) may be used. Other materials suitable to the elctrode include MgAgAl, LiAl and LiFAl. The combination of fluoride of an alkali metal an or alkali earth metal, and a low resistance metal such as alminum can be used, as well.

A second organic insulation layer (partition layer) 128 which separates each pixel is formed of one of polyimide, polyamide, polyimideamide, acrylic and benzocyclobutene (BCB). Thermosetting material or photo-curing material is applicable. The second organic insulation layer (partition layer) 128 is formed by applying the one of the above organic insulation material with thickness of 0.5 to 2 μm to cover all surface. Then, an opening fitting to the cathode layer 126 is formed. At this time, the opening is formed so as to cover the end of the wiring 123 and the inclination angle on its side is 35 to 45 degrees. The second organic insulation layer (partition layer) 128 extends not only over the pixel section 302 but also over the driving circuit section 301 and covers the wiring 117 to 124, thus, it also serves as an interlayer insulation film between layers.

The organic insulation material is hygroscopic and absorbs and occludes moisture. When the occluded moisture is released, the moisture is supplied to the organic compounds of the light emitting element 309, which deteriorates the organic light emitting element. To prevent the occlusion and the release of moisture, a fourth inorganic insulation layer 129 of 10 to 100 nm thickness is formed on the second organic insulation layer 128. The fourth inorganic insulation layer 129 is formed of an inorganic insulation material comprising nitrides. Particularly, it is formed with an inorganic insulation material selected from silicon nitride, aluminum nitride and aluminum oxynitride. The fourth inorganic insulation layer 129 is formed so as to cover the upper surface and side surface of the second organic insulation layer 128, and its end overlapping with the wiring 123 is tapered.

The anode layer 131 is formed across a plurality of pixels as a common electrode, and connects to the wiring 120 at a connection region 310 positioned outside of the pixel section 302 or between the pixel section 302 and the driving circuit section 301, then leads to an external terminal. ITO layer (indium oxide, tin) layer is formed as the anode layer 131. ITO may be added with zinc oxide or gallium for planarizing, or reducing the resistance.

On the anode layer 131, a fifth inorganic insulation layer 132 may be formed of one of silicon nitride, diamond-like-carbon (DLC), aluminum oxynitride, aluminum oxide or aluminum nitride. It is known that the DLC film has high gas barrier characteristic against oxygen, CO, $CO_2$ and $H_2O$. It is desirable to form the fifth inorganic insulation layer 132 in succession after the formation of the anodes 131 without exposing the substrate to the atmosphere. A buffer layer made of silicon nitride may be provided under the fifth inorganic insulation layer 132 in order to improve adhesion.

Although not shown in the figure, a sixth inorganic insulation layer of 0.5 to 5 nm thickness which allows flow of a tunnel current may be formed between the cathode layer 126 and the organic compound layer 130 containing light emitting material. The sixth inorganic insulation layer has an effect to prevent short circuit caused by any irregularity on the surface of the anode, and an effect to prevent alkali metal used for the cathode, or the like, from diffusing to the lower layer.

The second organic insulation layer 128 formed over the pixel section 302 extends to the driving circuit section 301, and seal patterns 133 are formed on the fourth inorganic insulation layer 129 formed on the second organic insulation layer 128. Some or all of the seal patterns 133 may overlap with the driving circuit section 301 and the wiring 117 which connects the driving circuit section 301 and the input terminal, which reduces the area of the frame region (peripheral region of the pixel section) of the light emitting apparatus. The light from the light emitting element 309 is emitted through this sealing plate.

A sealing plate 134 is secured via the sealing patterns 133. An organic resin including polyimide, polyethylene terephthalate (PET), polyethylene naphthalate (PEN), polyethersulfone (PES) and aramid as well as a glass substrate can be used for the sealing plate 134. The sealing plate made of an organic resin may be flexible and have 30 to 120 μm thickness. This prevents scratch on the surface of the sealing plate. The surface of the sealing plate may be coated with an inorganic insulation material such as DLC and silicon nitride as a gas barrier layer. One exemplary material for the seal patterns is epoxy adhesive. The side surface of the seal patterns may be coated with a film comprising inorganic insulation material, which prevents vapor from penetrating from the side surface.

In FIG. 1, the first TFT 305 has a multi-gate construction, and provided with a light doped drain (LDD) to reduce the off current. A LDD overlapping with the gate electrode is provided on the fourth TFT 306. A TFT made of poly-crystalline silicon is prone to deteriorate caused by a hot-carrier effect because it has a high operating rate. Therefore, as shown in FIG. 1, it is highly advantageous to form TFTs having different construction for different function in the pixel (switching TFT with sufficiently low off current and current control TFT durable to hot carrier injection), in order to manufacture a display apparatus having high reliability and good displaying performance (high operating performance).

Figure 2:
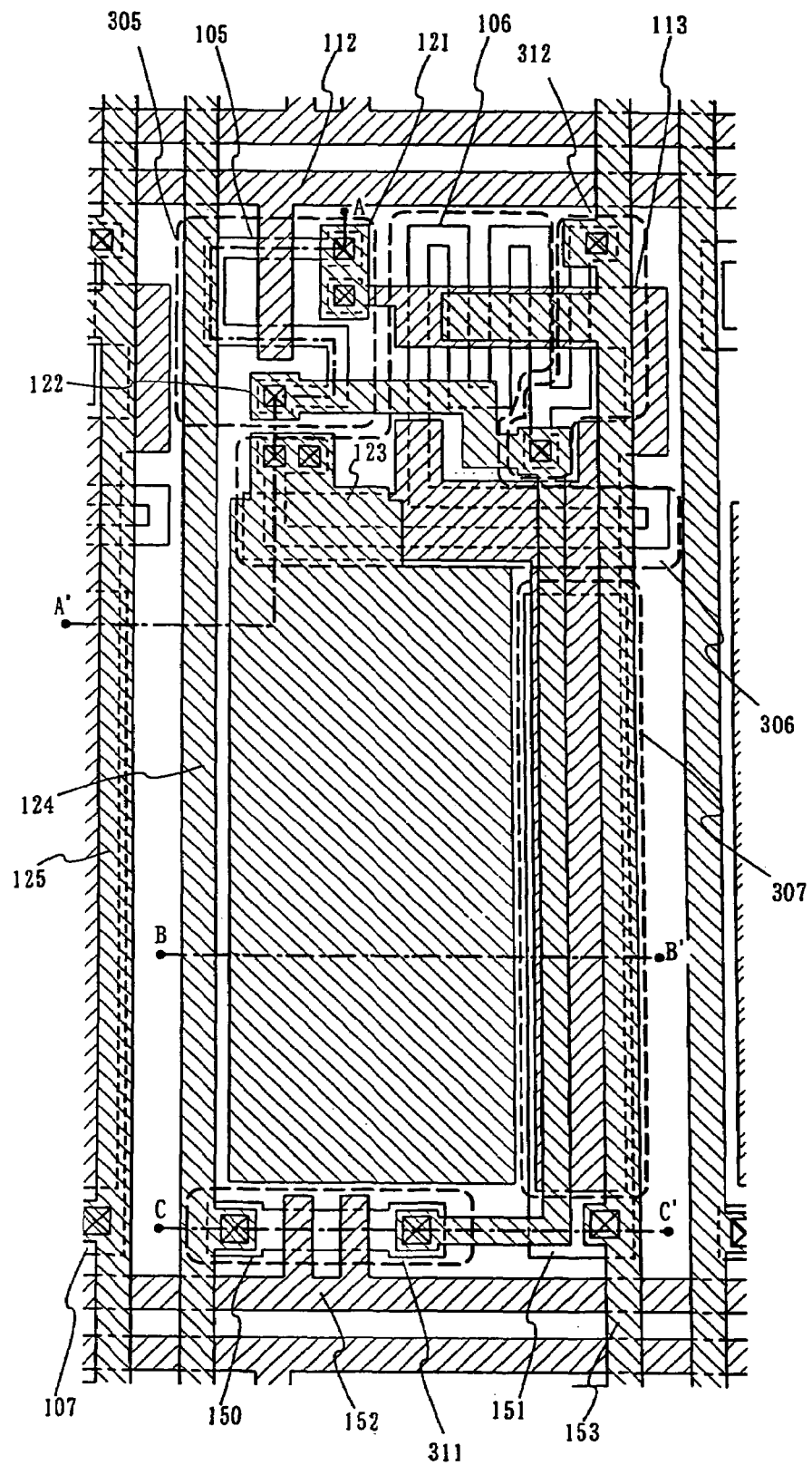
FIG. 2 is a top view which illustrates the construction of the pixel section of the light emitting apparatus according to the invention.
Figure 3:
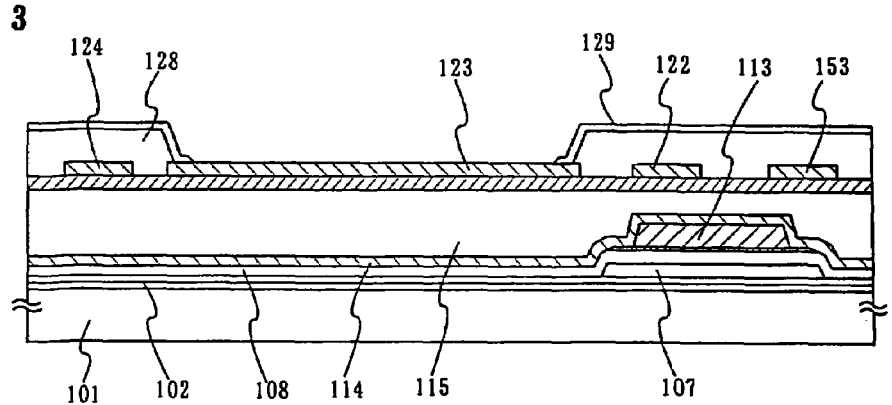
FIG. 3 is a cross-sectional view which illustrates the construction of the pixel section of the light emitting apparatus according to the invention.
Figure 4:
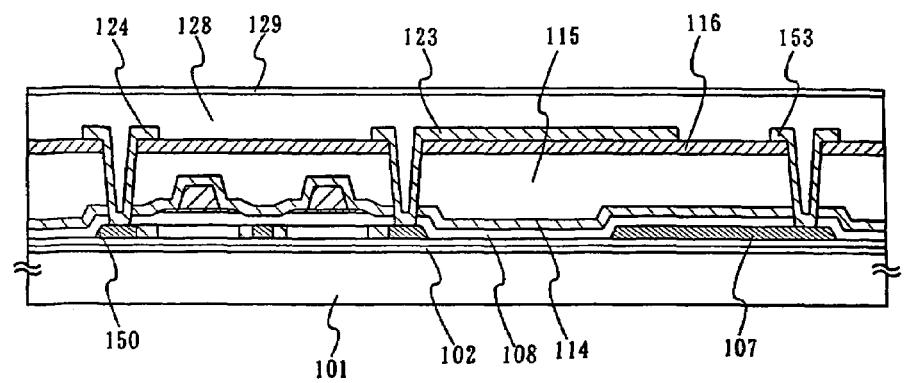
FIG. 4 is another cross-sectional view which illustrates the construction of the pixel section of the light emitting apparatus according to the invention.
Figure 17:
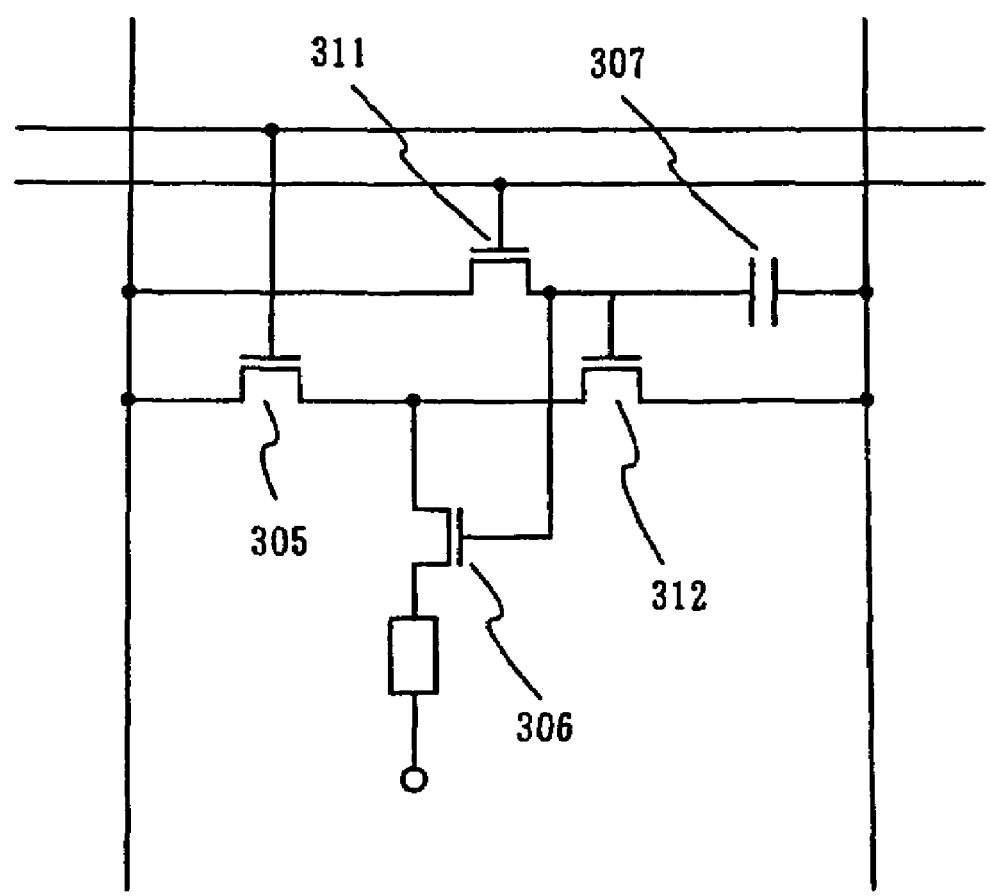
FIG. 17 is a circuit diagram equivalent to a pixel.

The top view of one pixel in the pixel section provided with the above TFT is shown in FIG. 2. In order to illustrate the arrangement of each TFT clearly, the patterns of the light emitting element 309, the second organic insulation layer 128 and the fourth inorganic insulation layer 129 are not shown in FIG. 2. One pixel contains the first TFT 305, a second TFT 311, a third TFT 312, the fourth TFT 306 and a capacity section 307. FIG. 17 schematically shows a circuit equivalent to the construction shown in FIG. 2. FIG. 1 shows the cross section across the line A-A' of FIG. 2. FIG. 3 shows the cross section across the line B-B', and FIG. 4 shows the cross section across the line C-C', of FIG. 2.

Figure 15:
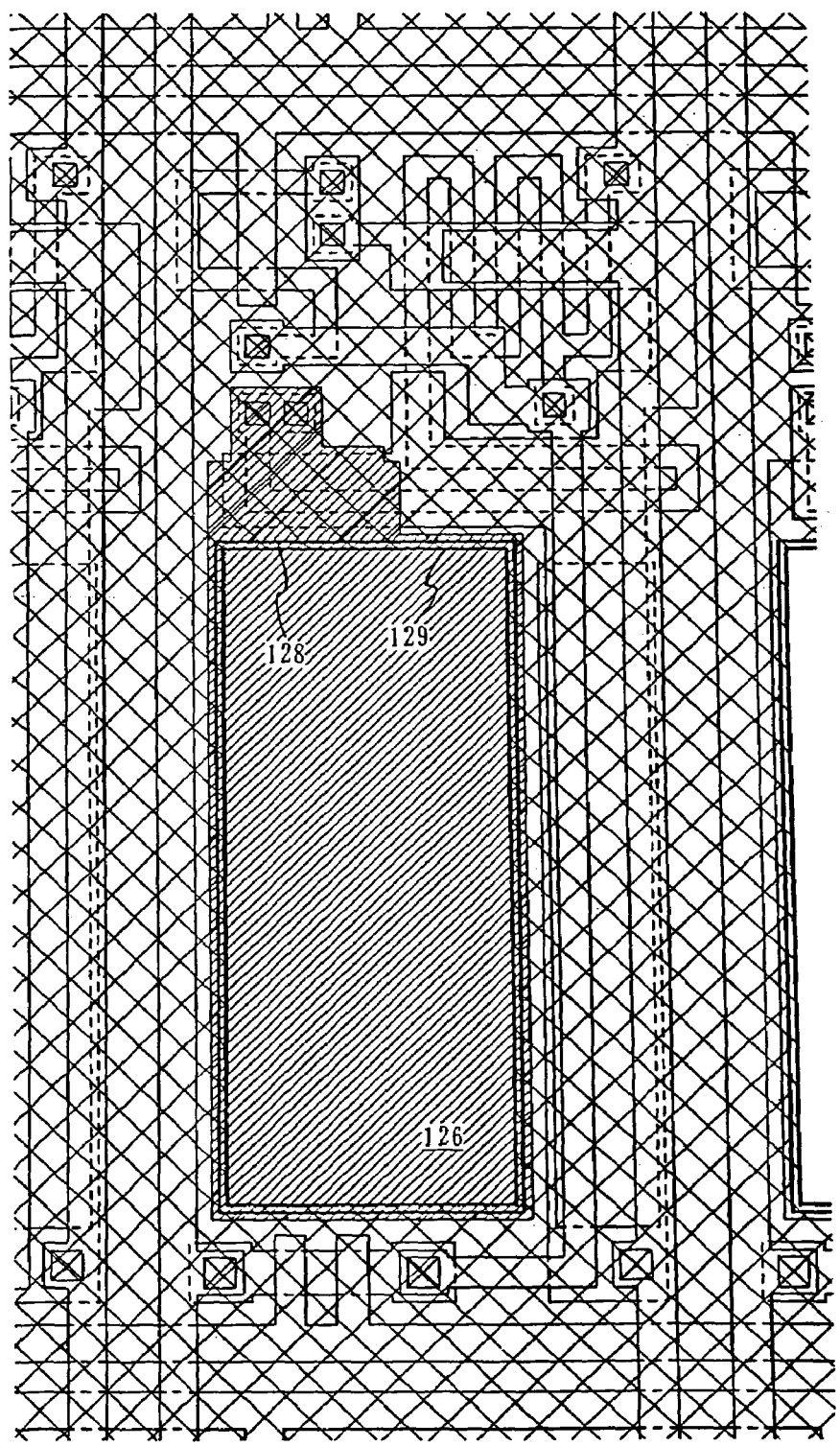
FIG. 15 is a top view which illustrates a construction of the pixel section of the light emitting apparatus according to the invention.
Figure 16:
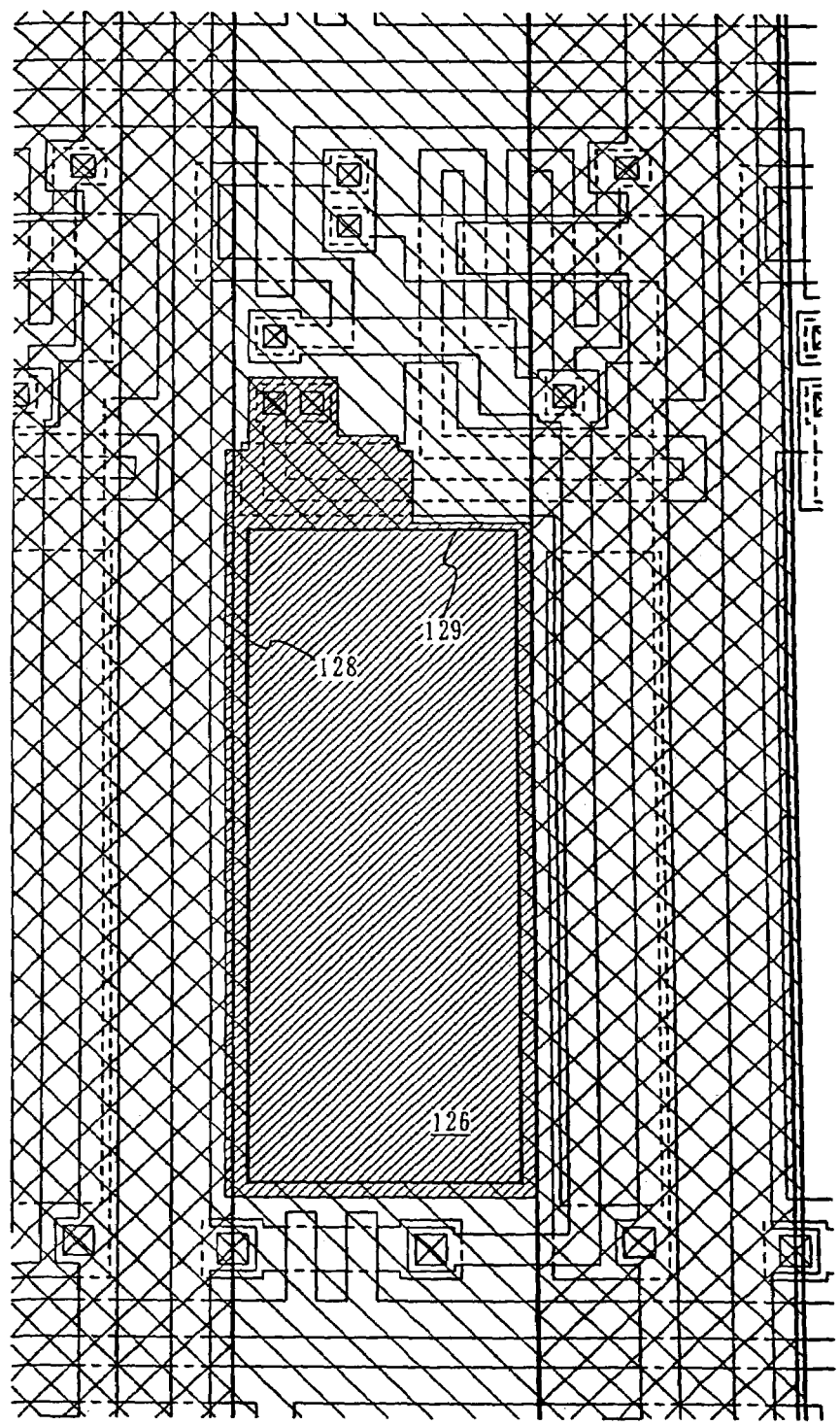
FIG. 16 is a top view which illustrates a construction of the pixel section of the light emitting apparatus according to the invention.

One exemplary construction of the second organic insulation layer 128 and the fourth inorganic insulation layer 129 in the pixel section is shown in FIG. 15, in which both of them cover the periphery of the cathode layer 126. In another exemplary construction shown in FIG. 16, the second organic insulation later 128 may cover only two sides of the cathode layer 126, while the fourth inorganic insulation layer 129 may cover all sides of the cathode layer 126.

Although not shown in FIG. 1, the driving circuit section 301 has different circuitry for the gate signal driving circuit and the data signal driving circuit. The wirings 118 and 119 are connected to the n-channel type TFT 303 and the p-channel type TFT 304, respectively, and these TFTs, in turn, can be used to form a shift register, a latch circuit or a buffer circuit.

Figure 7A:
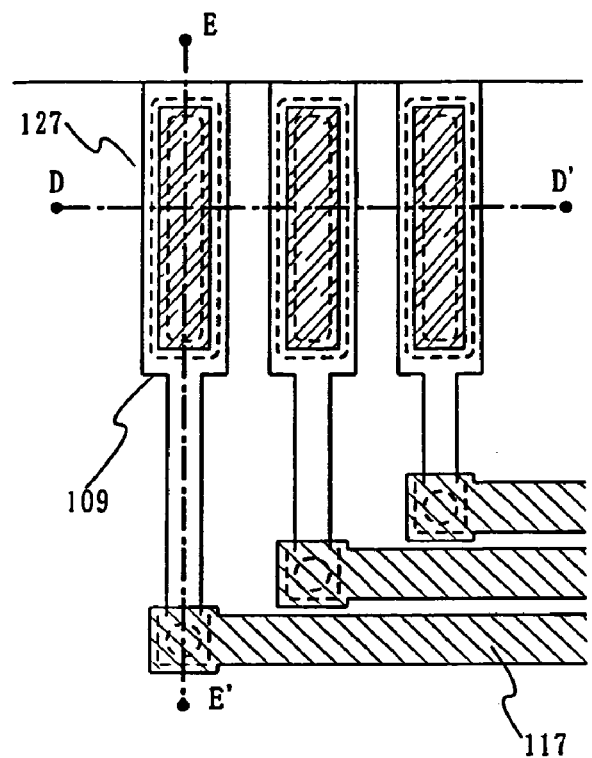
FIGS. 7A to 7C show a construction of the input terminal in the light emitting apparatus according to the invention.
Figure 7B:
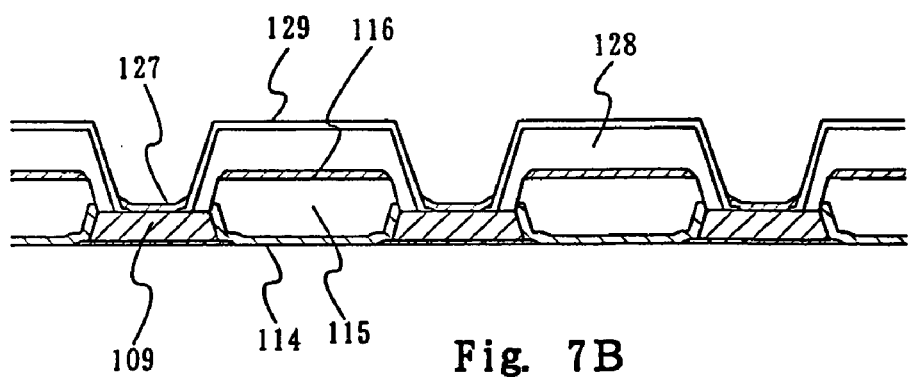
Figure 7C:
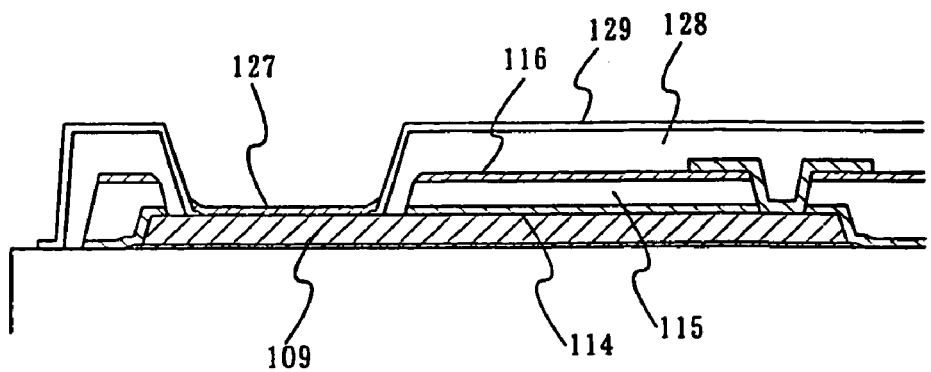

An input terminal 308 is formed from a wiring formed from the same layer as the gate electrode, or a wiring formed on the third inorganic insulation layer 116. FIG. 1 shows an example of the input terminal 308 formed from the same layer as the gate electrode, that is, the input terminal 308 is formed from conducting layers 109 and 127. The conducting layer 127 is formed of oxide conductive material, at the time when the anode layer 131 is formed. In practice, the part exposed to the surface is covered with the oxide conductive material to prevent the increase of surface resistance due to oxidation. FIG. 7 is a detailed illustration of the input terminal 308. FIG. 7A shows the top view, and FIGS. 7B and 7C show cross-sectional views across the line D-D' and E-E', respectively. The reference numerals in FIG. 7 are in common with those in FIG. 1.

As shown in FIG. 1, the first inorganic insulation layer 102 and the second inorganic insulation layer 114 are formed so as to sandwich the semiconductor layers 105 and 106. On the other hand, the organic light emitting element 309 is surrounded by the third inorganic insulation layer 116, the fifth inorganic insulation layer 132 and the fourth inorganic insulation layer 129. In other words, the semiconductor layers of the TFT and light emitting elements are coated with the inorganic insulation layers, respectively. The inorganic insulation layers are made from films of silicon nitride or silicon oxynitride, which forms a barrier against vapor and ionic impurities.

The possible source of an alkali metal such as sodium which contaminates the first TFT 305 and the fourth TFT 306 includes the substrate 101 and the organic light emitting element 309. In order to prevent the contamination from them, the first TFT 305 and the fourth TFT 306 are surrounded by the first inorganic insulation layer 102 and the second inorganic insulation layer 114. As the organic light emitting element 309 suffers the severest damage from oxygen and moisture, the third inorganic insulation layer 116, the fourth inorganic insulation layer 129, and the fifth inorganic insulation layer 132 are formed with inorganic insulation materials to prevent the contamination by oxygen or moisture. Also, these inorganic insulation layer serves to prevent the alkali metal element of the organic light emitting element 309 from diffusing to other sections.

Figure 5:
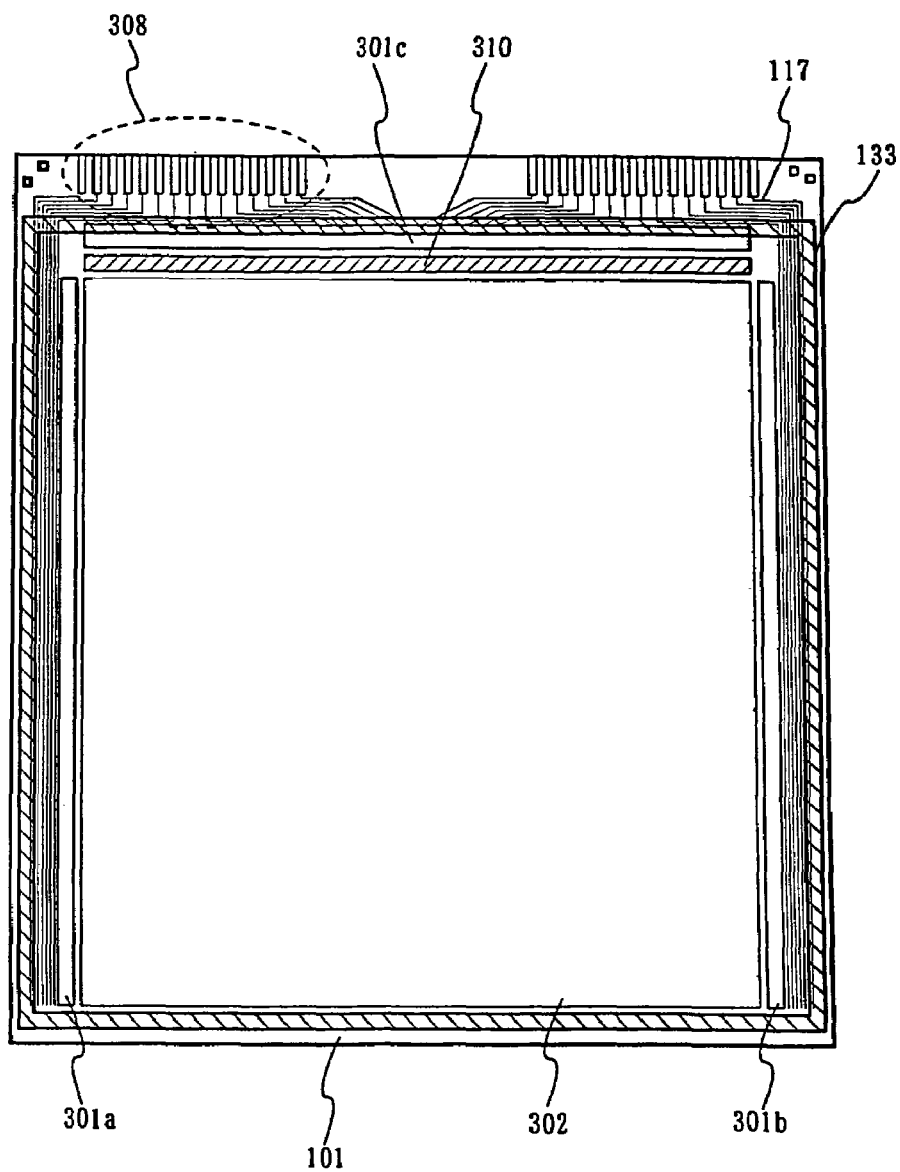
FIG. 5 is an outside view of a substrate comprising components of the light emitting apparatus according to the invention.

FIG. 5 shows an outside view of a substrate comprising components of the light emitting apparatus illustrated in FIGS. 1 to 4. The substrate 101 comprises the pixel section 302, a gate signal driving circuits 301a and 302b, a data signal driving circuit 301c, the connection 310 to the anode layer, the input/output terminal 308 and wiring or a group of wirings 117. The seal patterns 133 are provided so that the part or all of the patterns 133 overlap with the gate signal driving circuits 301a and 301b, data signal driving circuit 301c and the wiring or the group of wirings 117 which connects these driving circuit sections to the input terminal, in order to reduce the area of the frame region (peripheral of the pixel section) of the light emitting apparatus. The anode layer formed of ITO may have high resistivity, therefore, although FIG. 5 shows only one connection 310 to the anode layer, more than one connections 310 maybe provided on the other region around the pixel section 302.

Figure 6:
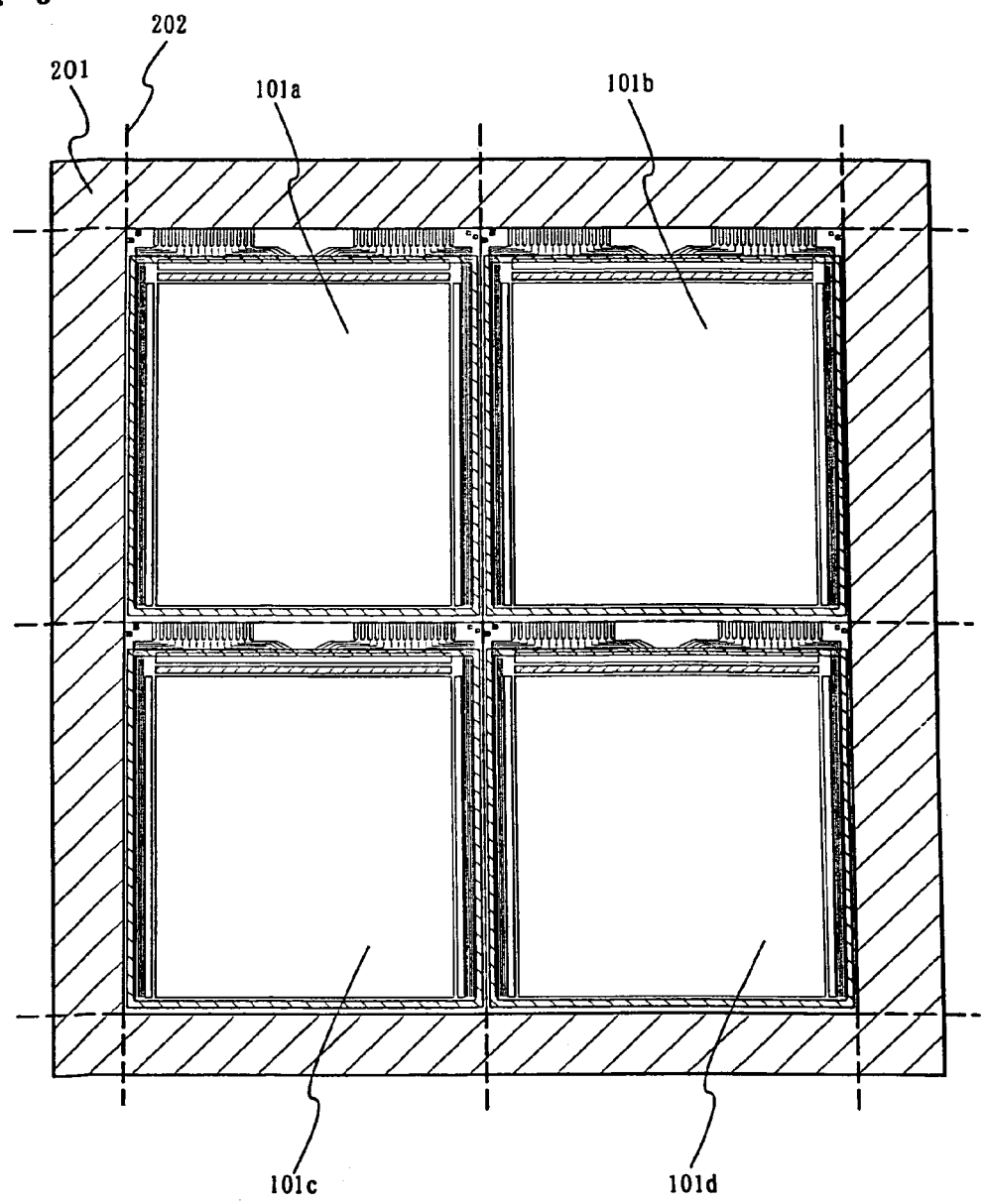
FIG. 6 is a view which illustrates a substrate constituting a light emitting apparatus formed on a mother glass, and its separation.

As shown in FIG. 6, a plurality of the substrates (101a to 101d) having above construction are provided on a mother glass 201, and separated along cutting lines 202 after the formation of one of the fourth inorganic insulation layer, the cathode layer, the fifth inorganic insulation layer or the sealing plate. The substrates are separated with a diamond cutter or a laser cutter. In order to make the separating process easier, the third to the fifth inorganic insulation layers and the first and the second organic insulation layers are preferably removed along the cutting lines 202.

As described, a TFT and alight emitting element are combined to form a pixel section to complete a light emitting apparatus. In the light emitting apparatus thus manufactured, driving circuits can be formed on the same substrate by using TFTs as the pixel section. As shown in FIG. 1, by surrounding the upper surface and the lower surface of the semiconductor film, the gate insulation film and the gate electrode, which are major components of a TFT, with blocking layers and the protective films comprising silicon nitride or silicon oxynitride, this construction prevents these components from being contaminated by an alkali metal and an organic material. The organic light emitting element, in turn, contains the alkali metal in part, and surrounded by a protective film comprising one of silicon nitride, silicon oxynitride, or DLC, and a gas barrier layer comprising an insulation film mainly consisting of silicon nitride or carbon, so that this construction prevents the penetration of oxygen or moisture from the outside.

The film comprising silicon nitride used for the inorganic insulation layers in this embodiment (silicon nitride film) is a highly fine film formed by the RF sputtering, according to the processing conditions shown in the table 1 (A typical example is illustrated). "RFSP-SiN" in the table indicates a silicon nitride film formed by the RF sputtering. "T/S" is the distance between the target and the substrate.

TABLE 1

RFSP-SiN processing condition

| | processing condition | representative example | comments |
|---|---|---|---|
| gas | $N_2$ or (noble gas)/$N_2$ | Ar/$N_2$ | each purity is 4 N or more |
| gas flow ratio | $N_2$: 30~100%, noble gas: 0~70% | Ar:$N_2$ = 20:20 (sccm) | noble gas may be introduced as gas for heating form the backside of a substrate |
| pressure (Pa) | 0.1~1.5 | 0.8 | |
| frequency (MHz) | 13~40 | 13.56 | |
| power (W/cm$^2$) | 5~20 | 16.5 | |
| substrate temperature (° C.) | RT (Room Temperature) ~350 | 200 | |
| target material | material carved out of single crystalline Si ingot | Si(1~10 Ωcm) | |
| T/S (mm) | 40~200 | 60 | |
| back-pressure (Pa) | $1 \times 10^{-3}$ or less (preferably $3 \times 10^{-5}$ or less) | $3 \times 10^{-5}$ | using turbo-molecular pump or cryopump |

Ar is introduced as sputtering gas to be sprayed on the back surface of the substrate to heat the same. The sprayed Ar is ultimately mixed with $N_2$ for sputtering. The values shown in the table 1 for forming a film are only exemplary values. As long as the physical parameters of the resulting SiN film fall in the range of the physical parameters shown in the table 4 (shown later), these conditions can be modified appropriately by the operator.

Figure 30:
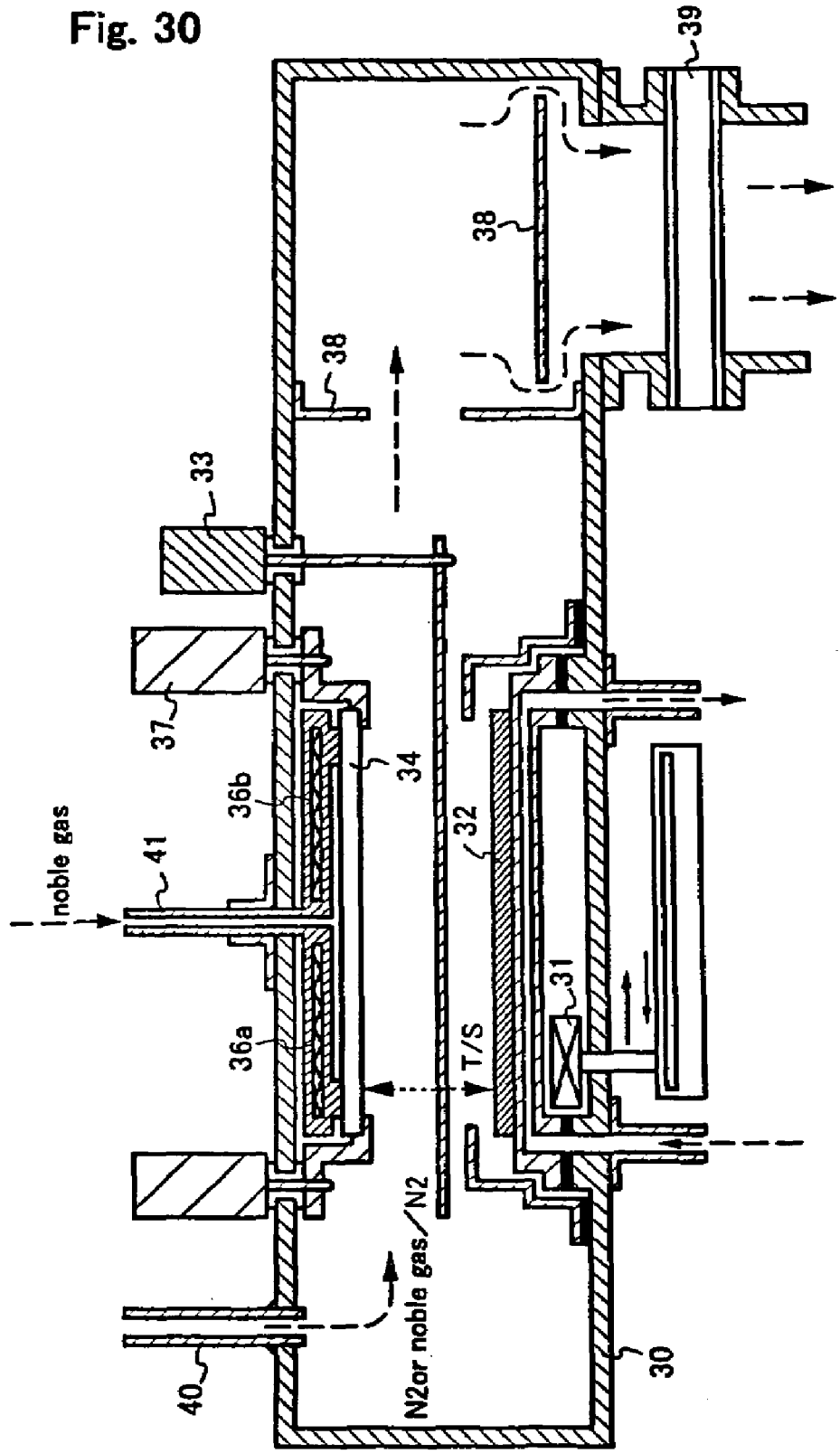
FIG. 30 is a view which illustrates a sputtering apparatus.

Next, a schematic view of a sputtering apparatus used to form a silicon nitride film by the above RF sputtering will be shown in FIG. 30. In FIG. 30, 30 is a chamber wall, 31 is a movable magnet for forming magnetic field, 32 is a single crystal silicon target, 33 is a protective shutter, 34 is a substrate to be processed, 36a and 36b are heaters, 37 is a substrate chuck device, 38 is an antitack plate and 39 is a valve (conductance valve or main valve). The chamber wall 30 is provided with gas intake tubes 40 and 41 which introduce $N_2$ (or mix gas of $N_2$ and inert gas), and inert gas, respectively.

Table 2 shows conditions to form a silicon nitride film formed by the conventional plasma CVD method, for reference. "PCVD-SiN" in the table refers to a silicon nitride film formed by the plasma CVD method.

TABLE 2 plasma CVD condition

| | PCVD-SiN |
|---|---|
| gas | $SiH_4/NH_3/N_2/H_2$ |
| gas flow ratio (sccm) | $SiH_4:NH_3:N_2:H_2$ = 30:240:300:60 |
| pressure (Pa) | 159 |
| frequency (MHz) | 13.56 |
| power (W/cm$^2$) | 0.35 |
| substrate temperature (° C.) | 325 |

Table 3 shows the the representative values of physical characteristics (physical parameters) of the silicon nitride film formed under the conditions in the table 1, and that formed under the conditions in the table 2. The differences between "RFSP-SiN (No. 1)" and "RFSP-SiN (No. 2)" are attributable to the difference between the film forming apparatuses, and do not impair the function of a silicon nitride film as a barrier film according to the invention. The internal stress may be compressive or tensile, and the sign of the numerical value changes accordingly, but the table shows only the absolute value.

TABLE 3 comparison between representative SiN physical parameters

| parameter | SiN prepared by the condition referring to the preparing condition in Table. 1 | | SiN prepared by the condition referring to the preparing condition in Table 2. | comments |
|---|---|---|---|---|
| | RFSP-SiN (No. 1) | RFSP-SiN (No. 2) | PCVD-SiN film | |
| specific inductive capacity | 7.02~9.30 | ← | ~7 | |
| refractive index | 1.91~2.13 | ← | 2.0~2.1 | Wavelength of irradiated light is 632.8 nm |
| internal stress (dyn/cm$^2$) | $4.17 \times 10^8$ | ← | $9.11 \times 10^8$ | |
| etching rate (nm/min) | 0.77~1.31 | 1~8.6 | ~30 | LAL500, 20° C. |

TABLE 3-continued comparison between representative SiN physical parameters

| parameter | SiN prepared by the condition referring to the preparing condition in Table. 1 | | SiN prepared by the condition referring to the preparing condition in Table 2. | comments |
|---|---|---|---|---|
| | RFSP-SiN (No. 1) | RFSP-SiN (No. 2) | PCVD-SiN film | |
| Si concentration (atomic %) | 37.3 | 51.5 | 35.0 | RBS |
| N concentration (atomic %) | 55.9 | 48.5 | 45.0 | RBS |
| H concentration (atoms/cm$^3$) | $4 \times 10^{20}$ | — | $1 \times 10^{22}$ | SIMS |
| O concentration (stoms/cm$^3$) | $8 \times 10^{20}$ | — | $3 \times 10^{18}$ | SIMS |
| C concentration (atoms/cm$^3$) | $1 \times 10^{19}$ | — | $4 \times 10^{17}$ | SIMS |

As shown in the table 3, the common characteristics in the RFSP-SiN (No. 1) and the RFSP-SiN (No. 2) are lower etching rate (the etching rate of the etching with LAL 500 at 20° C., ditto), and lower hydrogen concentration compared to that of the PCVD-SiN film. "LAL 500" is the "LAL 500 SA buffered hydrofluoric acid" which is solution of NH$_4$HF$_2$ (7.13%) and NH$_4$F (15.4%), manufactured by Hashimoto Kasei Co., Ltd. The absolute value of the internal stress is lower than that of the silicon nitride film formed by the plasma CVD method.

Next, various physical parameters of the silicon nitride film formed by the inventors under the conditions in table 1 are summarized in the table 4.

TABLE 4

SiN physical parameters used in the present invention

| parameter | SiN film used in the present invention | comments |
|---|---|---|
| specific inductive capacity | 7.0~9.5 (preferably 7.3~7.7) | |
| refractive index | 1.85~2.20 (preferably 1.90~2.15) | Wavelength of irradiated light is 632.8 nm |
| internal stress (dyn/cm$^2$) | $2 \times 10^{10}$ or less (preferably $5 \times 10^8$ or less) | |
| etching rate (nm/min) | 9 or less (preferably 0.5~3.5) | LAL500, 20° C. |
| Si concentration (atomic %) | 35~55 (preferably 37~52) | RBS |
| N concentration (atomic %) | 45~60 (preferably 48~56) | RBS |
| H concentration (atoms/cm$^3$) | $1 \times 10^{21}$ or less (preferably $5 \times 10^{20}$ or less) | SIMS |
| O concentration (atoms/cm$^3$) | $5 \times 10^{18}$~$5 \times 10^{21}$ (preferably $1 \times 10^{19}$~$1 \times 10^{21}$) | SIMS |
| C concentration (atoms/cm$^3$) | $1 \times 10^{18}$~$5 \times 10^{19}$ (preferably $1 \times 10^{18}$~$2 \times 10^{19}$) | SIMS |

Figure 24:
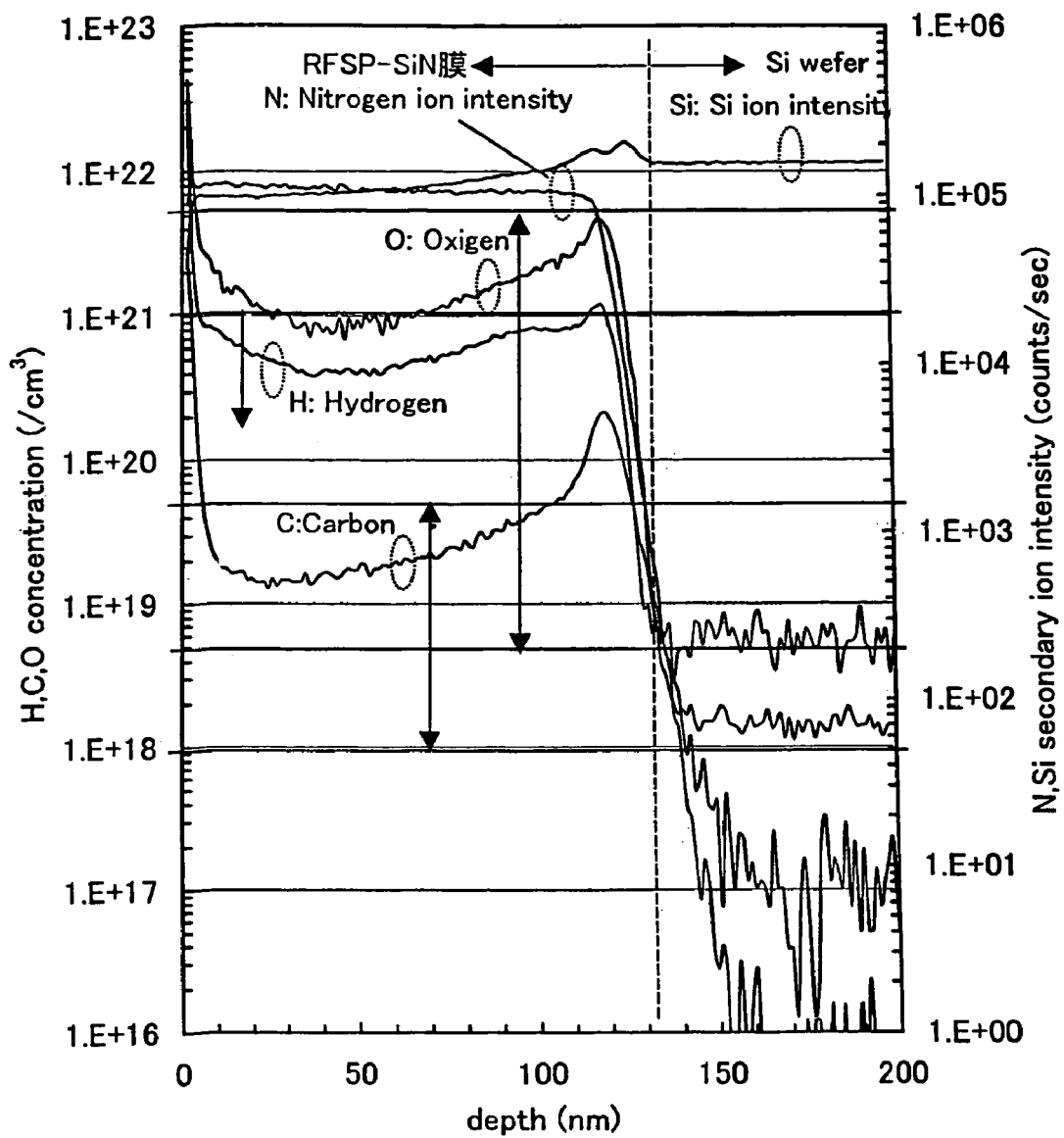
FIG. 24 is a graph which shows SIMS measurement data (secondary ion mass spectrometry) of the silicon nitride film.
Figure 25:
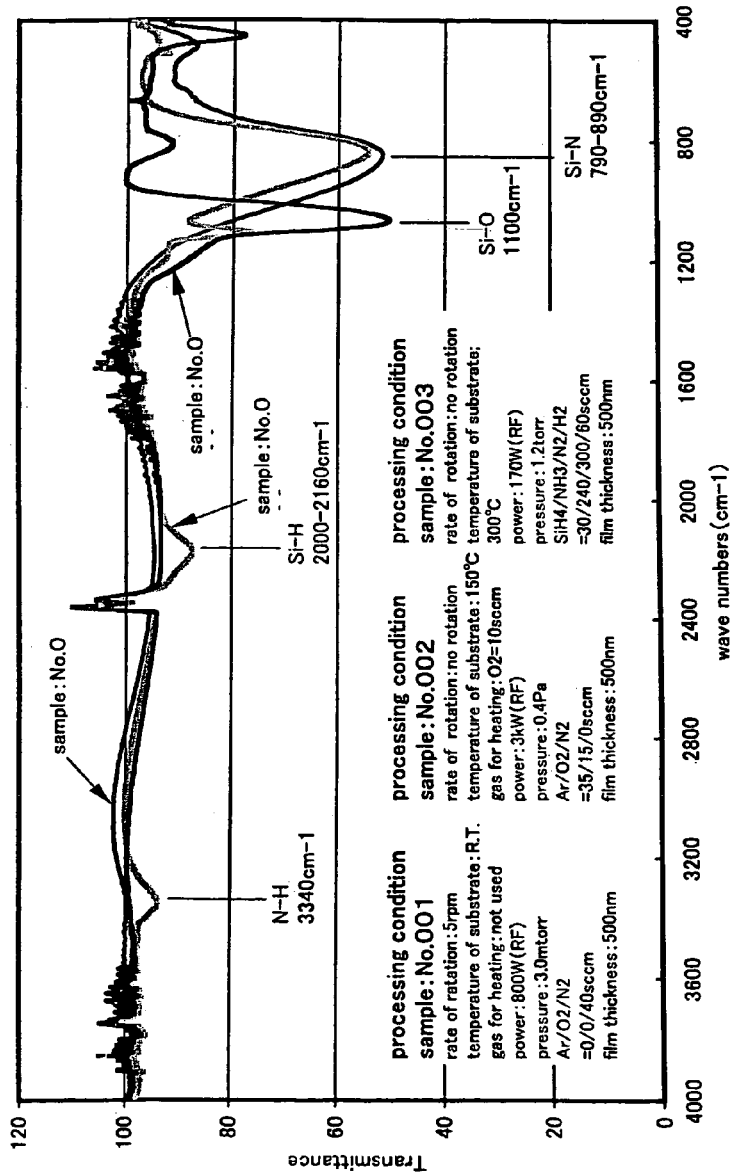
FIG. 25 is a graph which shows FT-IR measurement data of the silicon nitride film.
Figure 26:
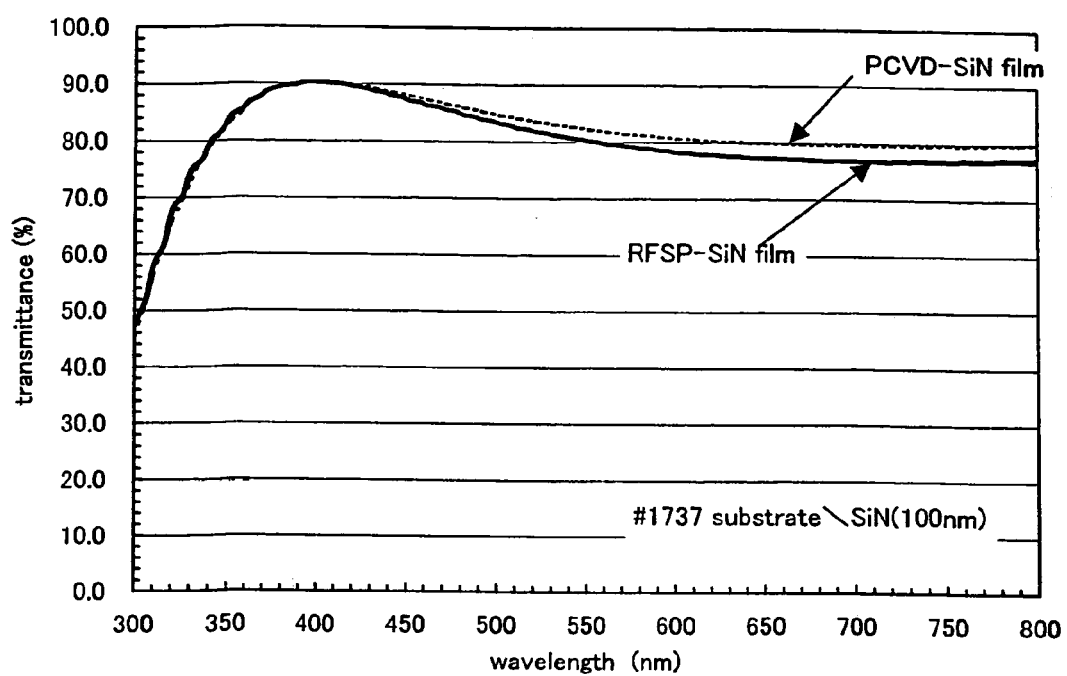
FIG. 26 is a graph which shows measurement of the transmittance of the silicon nitride film.

The results of the SIMS (secondary ion mass spectrometry) and FT-IR, and the transmittance, of the above silicon nitride film, are shown in FIGS. 24, 25 and 26, respectively. FIG. 26 also shows the silicon nitride film formed under the conditions of the table 2. The transmission factor is almost comparable to that of the conventional PCVD-SiN film.

The silicon nitride film used as an inorganic insulation layer according to the invention preferably satisfies the parameters shown in the table 4. That is, the inorganic insulation layer preferably satisfies one of the following conditions; (1) a silicon nitride film with etching rate of 9 nm/min or less (preferably, 0.5 to 3.5 nm/min or less), (2) hydrogen concentration of $1 \times 10^{21}$ atoms/cm$^3$ or less (preferably $5 \times 10^{20}$ atoms/cm$^3$ or less), (3) hydrogen concentration of $1 \times 10^{21}$ atoms/cm$^3$ or less (preferably $5 \times 10^{20}$ atoms/cm$^3$ or less), and oxygen concentration of from $5 \times 10^{18}$ to $5 \times 10^{21}$ atoms/cm$^3$ (preferably $1 \times 10^{19}$ to $1 \times 10^{21}$ atoms/cm$^3$), (4) etching rate of 9 nm/min or less (preferably, 0.5 to 3.5 nm/min or less), and hydrogen concentration of $1 \times 10^{21}$ atoms/cm$^3$ or less (preferably $5 \times 10^{20}$ atoms/cm$^3$ or less), and (5) etching rate of 9 nm/min or less (preferably, 0.5 to 3.5 nm/min or less), hydrogen concentration of $1 \times 10^{21}$ atoms/cm$^3$ or less (preferably $5 \times 10^{20}$ atoms/cm$^3$ or less),and oxygen concentration of from $5 \times 10^{18}$ to $5 \times 10^{21}$ atoms/cm$^3$ (preferably $1 \times 10^{19}$ to $1 \times 10^{21}$ atoms/cm$^3$).

The absolute value of the internal stress may be $2 \times 10^{10}$ dyn/cm$^2$ or less, preferably $5 \times 10^9$ dyn/cm$^2$ or less, and more preferably $5 \times 10^8$ dyn/cm$^2$ or less. The smaller internal stress can reduce the difference of the energy level between the films, as well as prevent the film from peeling by the internal stress.

The silicon nitride film formed under condition shown in the table 1 according to this embodiment has a distinct blocking effect against the elements belonging to Group 1 and Group 2 in the periodic table such as Na and Li, and can effectively suppress the diffusion of these mobile ions. For example, a metal film made of aluminum with 0.2 to 1.5 wt % (preferably, 0.5 to 1.0 wt %) lithium added is preferred for a cathode layer of this embodiment in terms of various physical characteristics including charge injection characteristic. However, when using this type of metal film, the lithium may diffuse and damage the performance of the transistor. To prevent this damage, the present embodiment completely protects the transistor with inorganic insulation layers, so that the lithium would not diffuse to the transistor.

Figure 27:
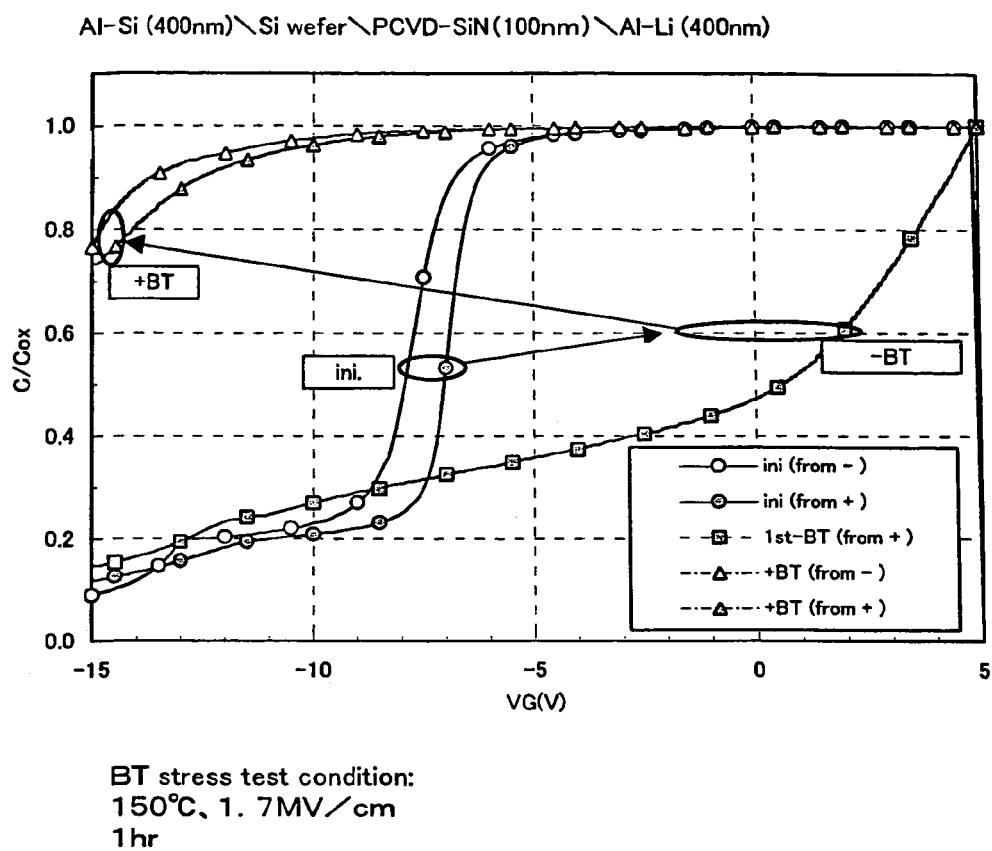
FIG. 27 is a graph which shows the C-V characteristics before and after the BT stress test of the MOS construction.

This is shown in the data in FIGS. 27 to 29. FIG. 27 is a diagram that shows the change in the C-V characteristic before and after the BT stress test of the MOS structure which has a silicon nitride film (PCVD-SiN film) formed under conditions of the table 2 as a dielectric. The construction of the sample is shown in FIG. 29A, and the effect of the diffusion of the lithium can be determined by using Al—Li (lithium added aluminum) electrode as the surface electrode.

As shown in FIG. 27, the BT stress test reveals that the C-V characteristic is significantly shifted, which indicates that the lithium diffused from the surface electrode has a substantial effect.

FIGS. 28A and 28B show the C-V characteristic before and after the BT stress test of the MOS structure which has a silicon nitride film formed under conditions of the table 1 as a dielectrics. The difference in the tests of FIG. 28A and FIG. 28B is that, an Al—Si (silicon added aluminum film) electrode is used as a surface electrode in FIG. 28A, while an Al—Li (lithium added aluminum film) electrode is used as a surface electrode in FIG. 28B. The result of FIG. 28B is the result of the measurement of the MOS construction shown in FIG. 29B. In FIG. 29B, the films are laminated with thermally-oxidized film in order to reduce the effect of difference in energy levels at the interface between the silicon nitride film and the silicon substrate.

As can be seen from the graphs in FIGS. 28A and 28B, the C-V characteristics before and after the BT stress test have similar shift pattern, which indicates that there is no effect of lithium diffusion, that is, the silicon nitride film formed under the conditions of the table 1 effectively serves as a blocking film.

As described, since the inorganic insulation layer used in this invention is extremely fine and has such high blocking effect against mobile elements such as Na and Li, it can suppress diffusion of degassed components from the planarizing film as well as suppress the diffusion of Li from the Al—Li electrode effectively. Taking advantage of these effects, a highly reliable display apparatus can be realized. The inventors suppose that the inorganic insulation layer can be made fine since silicon clusters cannot easily contaminate the film, as a thin silicon nitride film is formed on the surface of the single crystal silicon target, then the silicon nitride film thus manufactured is laminated on the substrate.

Also, as the silicon nitride film is formed by the sputtering method at lower temperature i.e., from the ambient temperature to about 200° C., the silicon nitride film which is used as a barrier film according to the invention can be formed on the resin films, which is another advantage over plasma CVD method. The above silicon nitride film can be used as a part of a gate insulation film when forming it by laminating.

EMBODIMENT

Embodiment 1

Next, the process of manufacturing the light emitting apparatus shown in FIG. 1 is described in detail with reference to the figures.

In FIG. 8A, the substrate 101 maybe one of a glass substrate, a quartz substrate or a ceramic substrate. The substrate 101 may comprise a silicon substrate, a metal substrate or a stainless substrate with an insulation film formed thereon. A plastic substrate having heat resistance bearable to the processing temperature of the embodiment may be used.

A first inorganic insulation layer 102 consisting of a insulation film such as a silicon oxide film, a silicon nitride film or a silicon oxynitride film ($SiO_xN_y$) is formed on the substrate 101. A typical example has two-layer construction, in which the first silicon oxynitride film of 50 nm thickness is formed using $SiH_4$, $NH_3$ and $N_2O$ as a reaction gas, and the second silicon oxynitride film of 100 nm thickness is formed on the first film, using $SiH_4$ and $N_2O$ as a reaction gas.

The semiconductor layer can be obtained by crystallizing the amorphous semiconductor film formed on the first inorganic insulation layer 102. The amorphous semiconductor film is formed with thickness of 30 to 60 nm, and crystallized by heating, or irradiating laser beams. There is no restriction on the material of the amorphous semiconductor film, however, silicon or silicon germanium ($Si_{1-x}Ge_x$; 0<x<1. Representative value for x is 0.001 to 0.05) alloy may be preferably used.

In a representative example, the amorphous silicon film of 54 nm thickness is formed by the plasma CVD method using $SiH_4$ gas. In crystallization, a pulse oscillating or a continuous oscillating excimer laser, or a YAG laser, a $YVO_4$ laser or a YLF laser which are doped with one of Cr, Nd, Er, Ho, Ce, Co, Ti or Tm can be used. When using one of a YAG laser, a $YVO_4$ laser or a YLF laser, the second harmonic to the fourth harmonic can be used. When using one of these lasers, the laser beam irradiated from the laser oscillator can be linearly collected by an optical system to irradiate on the semiconductor film. The condition of the crystallization can be selected by the operator appropriately.

For crystallization, certain metal element such as nickel which can serve as a catalyst for the crystallization of the semiconductor can be added. An exemplary process of crystallization is; holding a solution containing nickel on the amorphous silicon film, dehydrogenating (500° C. for one hour), crystallizing by furnace annealing at 550° C. for four hours or gas heating rapid annealing at 740° C. for 180 seconds, then irradiating the second harmonic of a continuous oscillating laser selected from an excimer laser, a YAG laser, a $YVO_4$ laser, or a YLF laser, in order to improve the crystallization.

Figure 12:
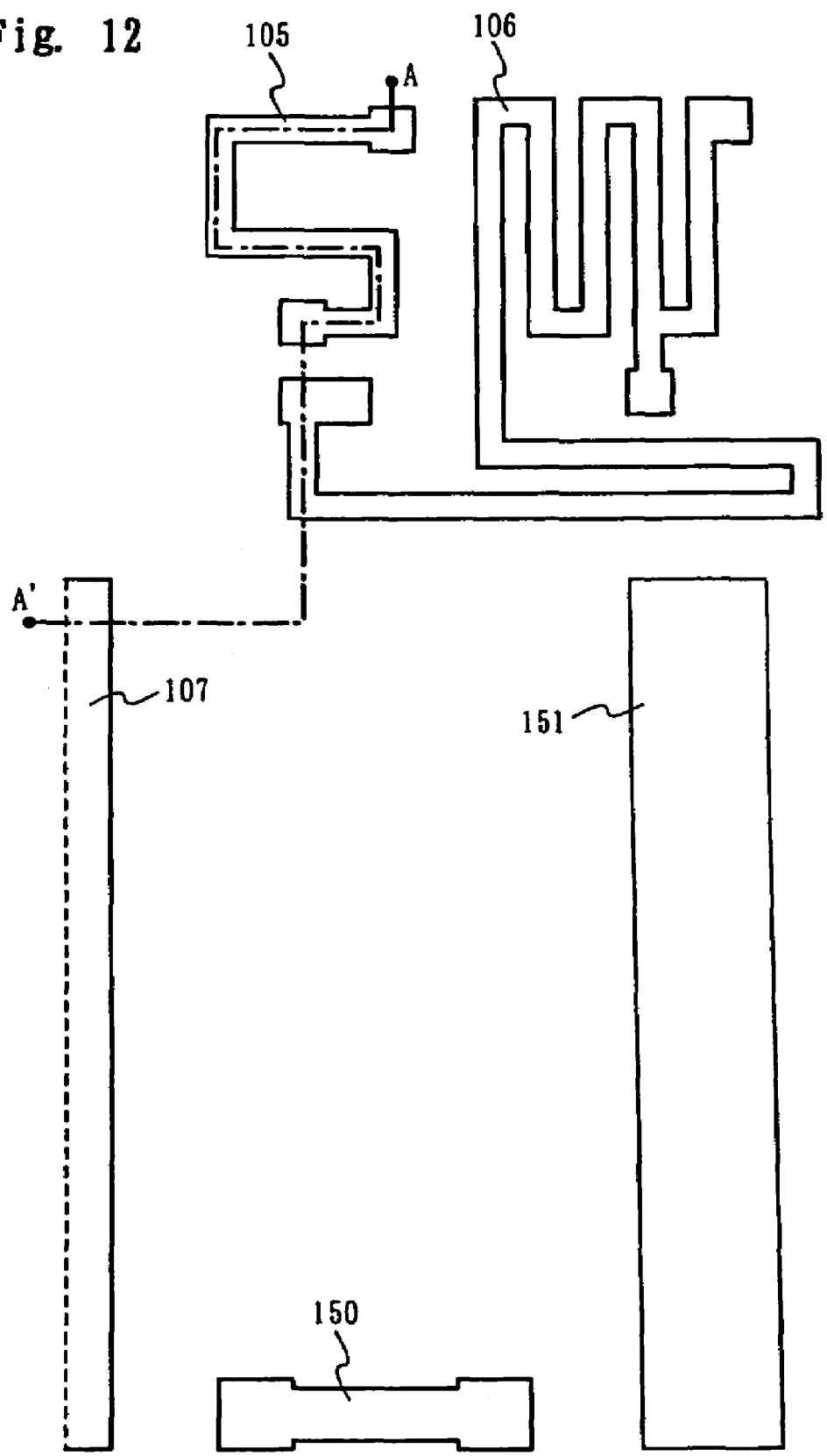
FIG. 12 is a top view which illustrates manufacturing processes of the light emitting apparatus according to the invention.

The resulting crystalline semiconductor film is etched in a desired form by photolithography using a photo mask (1) to form semiconductor layers 103 to 107 separated like islands. FIG. 12 shows a top view of the pixel formation section on this point.

Also, after crystallization of the amorphous semiconductor film, the film can be doped with p-type impurity element in order to control threshold of the TFT. P-type impurity elements include the elements belonging to the Group 13 in the periodic table, such as boron (B), aluminum (Al) and garium (Ga).

Next, as shown in FIG. 8B, the gate insulation film 108 covering the semiconductor layers 103 to 107 separated like islands is formed. The gate insulation film 108 of 40 to 150 nm thickness is formed from insulation film containing silicon by the plasma CVD method or the sputtering using inorganic insulation materials such as silicon oxide or silicon oxynitride. This gate insulation layer can use insulation film containing silicon as a single layer construction or a laminated construction.

A first conductive film 10 of 30 nm thickness comprising tantalum nitride (TaN), and a second conductive film 11 of 400 nm thickness comprising tungsten (W) are laminated on the gate insulation film 108 in order to form a gate electrode. Other conductive material for gate electrode may be selected from Ta, W, Ti, Mo, Al, Cu, or an alloy or a chemical compound having one of above elements as a main component. Also, a semiconductor film including a poly-crystalline silicon film doped with an impurity element such as phosphorous may be used. Furthermore, a combination of the first conductive film of a tantalum film (Ta) and the second conductive film of a W film, a combination of the first conductive film of a tantalum nitride (TaN) film and the second conductive film of a Al film, or a combination of the first conductive film of a tantalum nitride (TaN) film, and the second conductive film of Ti film may be also accepted.

Next, as shown in FIG. 8C, a mask 12 by which gate electrode patterns are formed by photolithography is formed by using a photo mask (2). After that, the first etching is performed with dry-etching, for example, ICP (Inductively Coupled Plasma) etching. There is no restriction on the etching gas, however, $CF_4$, $Cl_2$ and $O_2$ are used for etching of W and TaN. In the first etching, predetermined biasing voltage is applied to the substrate to make inclination angle of 15 to 50 degrees on the side surface of the formed electrode patterns 13 to 17. The first etching reduces the thickness of the exposed region of surface of the insulation film by 10 to 30 nm.

Figure 13:
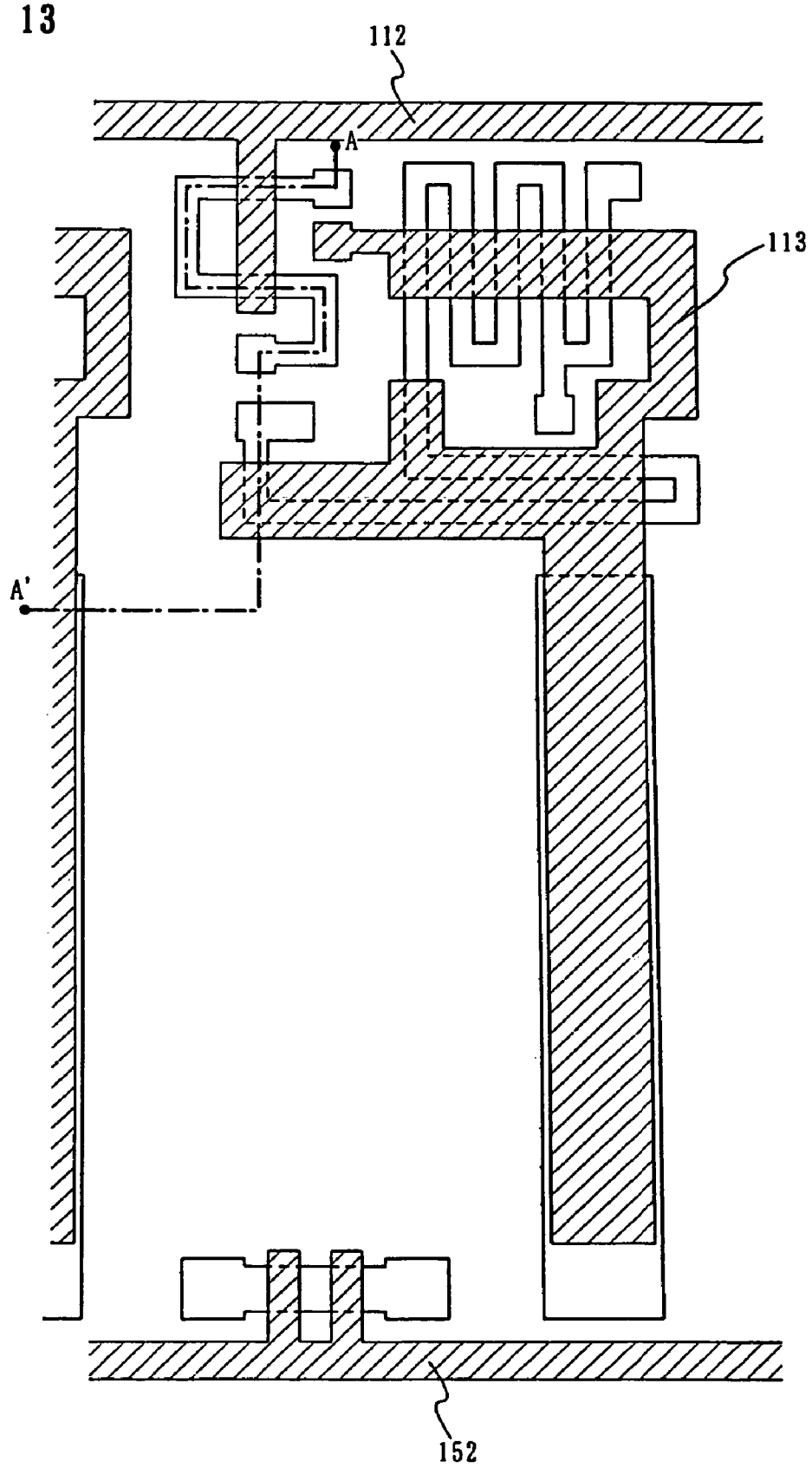
FIG. 13 is a top view which illustrates manufacturing processes of the light emitting apparatus according to the invention.

Next, anisotropic etching is performed on the W film using $SF_6$, $Cl_2$ and $O_2$ as etching gases, and applying predetermined biasing voltage to the substrate, changing the first etching condition to the second etching condition. The gate electrodes 110 to 113 and the wiring 109 of an input terminal are thus formed. After that, the mask 12 is removed. The second etching further reduces the thickness of the exposed region in the surface of the insulation layer by about 10 to 30 nm. FIG. 13 shows a top view of the pixel formation section at this point.

After formation of the gate electrode, a first doping is performed as shown in FIG. 9A to form first n-type impurity regions in 18 to 22 on the semiconductor layer. These first n-type impurity regions are formed in a self-aligned manner using the gate electrode as a mask. The doping condition can be set appropriately, using 5% $PH_3$ diluted with hydrogen, and injecting $6\times10^{13}/cm^2$ dose at 50 kV.

Next, as shown in FIG. 9B, a mask 23 is formed by using a photo-mask (3) and a second doping is performed by photolithography. The second doping uses 5% $PH_3$ diluted with hydrogen, and injects $3\times10^{15}/cm^2$ dose at 65 kV to form second n-type impurity regions 24, 25 and 27 and third n-type impurity regions 26 and 28. The second n-type impurity region 24 and the third n-type impurity region 26 formed in the semiconductor layer 103 are formed in a self-aligned manner using the gate electrode as a mask. The second n-type impurity region 27 and the third n-type impurity region 28 formed in the semiconductor layer 106 are formed in a self-aligned manner using the gate electrode as a mask. In the semiconductor layer 105, the second n-type impurity region 25 is formed by-the mask 23.

As shown in FIG. 9C, a mask 29 is formed by using a photo-mask (4), and a third doping is performed by photolithography. The third doping uses 5% $B_2H_6$ diluted with hydrogen, and injecting $2\times10^{16}/cm^2$ dose at 80 kV to form a p-type impurity region 30 in the semiconductor layer 104.

As the result of the above processes, the impurity regions having either n-type conductivity or p-type conductivity are formed on each semiconductor layer, respectively. As shown in FIG. 10A, in the semiconductor layer 103, the second n-type impurity region 24 acts as a source or drain region, and the third n-type impurity region 26 acts as a LDD region. In the semiconductor layer 104, the p-type impurity region 30 acts as a source or drain region. In the semiconductor layer 105, the second n-type impurity region 25 acts as a source or drain region, and the first n-type impurity region 20 acts as a LDD region. In the semiconductor layer 106, the second n-type impurity region 27 acts as a source or drain region, and the third n-type impurity region 28 acts as a LDD region.

Next, the second inorganic insulation layer 114 covering almost all the surface is formed. The second inorganic insulation layer 114 of 100 to 200 nm thickness is formed using the plasma CVD or the sputtering, with an inorganic insulation material containing silicon and hydrogen. The preferred example is an silicon oxynitride film of 150 nm thickness formed by the plasma CVD.

After formation of the second inorganic insulation layer 114, each impurity element added to each semiconductor layer is activated. Activation is performed by heating in a furnace anneal or a clean oven. The temperature is 400 to 700° C., typically, 410 to 500° C. of nitrogen atmosphere. The impurity regions may be activated by laser anneal, or rapid thermal anneal (RTA), as well.

Next, as shown in FIG. 10B, the first organic insulation layer 115 of 0.5 to 1 μm is formed on the second inorganic insulation layer 114. Thermosetting acrylic material can be used as the organic insulation layer, which is spin-coated, then calcined at 250° C. to form planarized film. On this film, the third inorganic insulation layer 116 of 50 to 100 nm thickness is formed.

When forming the third inorganic insulation layer 116, the substrate having the second inorganic insulation layer 114 formed thereon is heated at 80 to 200° C. under reduced pressure for dehydration. An exemplary material suitable for the third inorganic insulation layer 116 is silicon nitride formed by sputtering using silicon as a target.

Conditions for forming a film can be selected appropriately. Preferably, nitrogen ($N_2$) or mix of nitrogen and argon is applied as sputtering gas by RF power for sputtering. The substrate may be processed in atmosphere temperature, without heating. An exemplary process shows infrared absorption spectrum of the silicon nitride film (#001) formed by applying RF power (13.56 MHz) using silicon as a target, and using only nitrogen gas for sputtering. The film is formed by using silicon target boron added by 1 to 2 Ωsq., applying 0.4 Pa, 800 W RF power (13.56 MHz) and applying only nitrogen gas. The target has a diameter of 152. 4 mm. The resultant silicon nitride film has oxygen content of 20 atomic % or less, preferably 10 atomic % or less. By reducing oxygen concentration, the film can be more fine and can improve transmittance of light in short-wavelength range.

Next, as shown in FIG. 10C, a mask pattern is formed from photo-mask (5) by photolithography. A contact hole 30 and an opening 31 of the input terminal are formed by using a photo-mask (5), forming mask patterns by photolithography, and dry-etching. The conditions of the dry-etching are as follows; etching the third inorganic insulation layer 116 and the second inorganic insulation layer 114 using $CF_4$, $O_2$ and He, then, etching the second inorganic insulation layer is performed and the gate insulation layer using $CHF_3$.

After that, as shown in FIG. 11A, wirings and pixel electrodes are formed using Al, Ti, Mo or W. A photo-mask (6) is used for forming wirings. For example, a laminated film of a Ti film of 50 to 250 nm thickness and an alloy film comprising Al and Ti of 300 to 500 nm thickness may be used. The wirings 117 to 125 are thus formed.

Next, as shown in FIG. 11B, the second organic insulation layer 128 is formed. This layer is formed with an acrylic material similar to the first organic insulation layer 115. Then, openings are formed on the wiring 123, the connection of the anode layer 310, and the input terminal by using a photo-mask (7). The second organic insulation layer 128 is formed so as to cover the end of the wiring 123, and its side surface has an inclination angle of 45 degree.

The organic insulation material is hygroscopic and occludes moisture. In order to prevent the occlusion and release of moisture, a fourth inorganic insulation layer 129 of 10 to 100 nm thickness is formed on the second organic insulation layer 128. The fourth inorganic insulation layer 129 is formed of inorganic insulation material consisting of a nitride. The fourth inorganic insulation layer 129 is formed from a silicon nitride film manufactured by the sputtering. The applicable film is similar to that for the third inorganic insulation layer 116. The fourth inorganic insulation layer 129 is formed into predetermined patterns by using a photomask (8), and covers the upper surface and the side surface of the second organic insulation layer 128, with a tapered end overlapping with the wiring 123. Thus, the fourth inorganic insulation layer 129 is formed at the input terminal so as to cover the side surface of the opening formed in the second organic insulation layer 128, so that it prevents moisture from penetrating from this region.

Next, the cathode layer 126 is formed by using calcium fluoride or cesium fluoride as a material and depositing it by vacuum deposition. Then, the organic compound layer 130 containing light emitting material is formed. The anode layer 131 is formed on the organic compound layer containing light emitting material, by the sputtering or resistance heating deposition. ITO can be used as the anode layer 131. Patterns on these layers are formed by using a metal-mask (also called a shadow-mask). The anode layer 131 is the electrode to which common potential is applied, and extended to the connection 310 to contact to the wiring 120. Also, ITO film 127 is formed on the wiring at the input terminal.

Noble gas (typically argon) is used in sputtering method. Ions of sputtering gas are not only accelerated by sheath electric field and clash with a target, but also are accelerated by weak sheath electric field and implanted into the organic compound layer 130 containing a light emitting material under the anode. The noble gas prevents molecules or atoms from displacing by positioning between lattices of the organic compound layers and improves stability of the organic compounds. Further, the fifth inorganic insulation layer 132 formed on the anode 131 is formed of silicon nitride or DLC film. The ions of noble gas (typically argon)are accelerated by weak sheath electric field on the side of substrate and implanted into the organic compound layer 131 under the anode 131 passing through the anode. Then, an effect of improving stability of the organic compound can be obtained.

Then, seal patterns are formed, a sealing plate is adhered to manufacture a light emitting apparatus shown in FIG. 1. According to the above processes, a light emitting apparatus can be completed with eight photo-masks.

Embodiment 2

Figure 14:
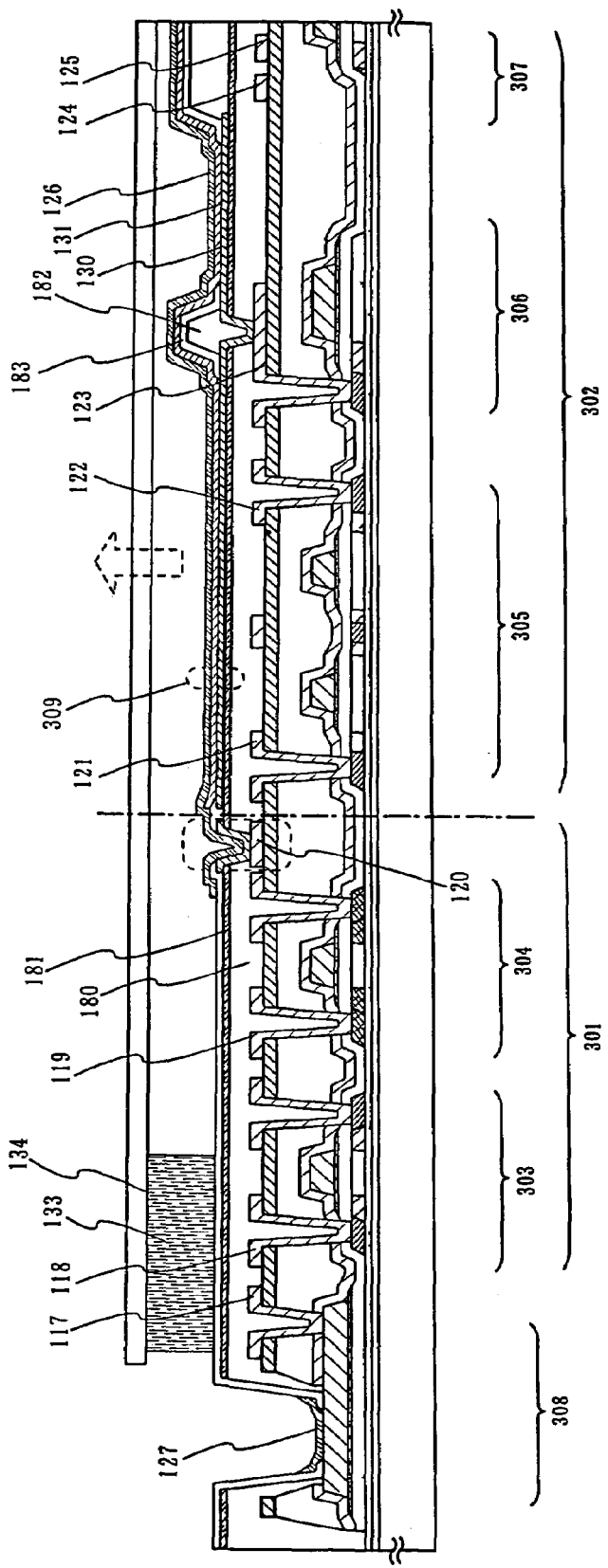
FIG. 14 is a cross-sectional view which illustrates a construction of the light emitting apparatus according to the invention.

Next, a light emitting apparatus having different structure than that of the embodiment 1 will be described with reference to FIG. 14. The processes from the beginning to the formation of the third inorganic insulation layer 116 are same as those in the embodiment 1. Then, a contact hall and wirings 117 to 125 are formed.

Next, a third organic insulation layer 180 of about 1 μm thickness is formed of materials such as acrylic or polyimiide. On this third organic insulation layer 180, a seventh inorganic insulation layer 181 is formed with silicon nitride for the same reason as the embodiment 1.

A contact hall connecting to the wiring 123 and a cathode layer 126 are formed. A fourth organic insulation layer 182 is formed at the end of the cathode layer 126 and the recess of the contact hall. The surface of the fourth organic insulation layer 182 is covered with an eighth inorganic insulation layer 183. After that, an organic compound layer 130 containing light emitting material, an anode layer 131, seal patterns 133 are formed, and a sealing plate is adhered to complete the light emitting apparatus.

Embodiment 3

This embodiment has a different construction than that of the embodiment 1 for the pixel section, as illustrated in FIGS. 31 and 32. In this embodiment, the processes from the beginning to the formation of the third inorganic insulation layer 116 and wiring 123 on the third inorganic insulation layer 116 are same as FIG. 1.

As shown in FIG. 31A, a second organic insulation layer 180 covering the end of the wiring 123 is formed of a photosensitive, negative-type acrylic resin. Thus, the end where the second organic insulation layer 180 contacts with the wiring 123 has a inclined surface having a curvature as shown in the figure, the shape of which can be expressed by at least two curvatures R1 and R2. The center of the R1 is located above the wiring, while that of the R2 is located below the wiring. This shape may vary slightly depending on the exposure, but the thickness of the film is 1.5 μm and the value for R1 and R2 is 0.2 to 2 μm. The inclined surface has continuously varying curvatures.

Then, along the inclined surface having these smooth curvatures, a fourth inorganic insulation layer 129, a cathode layer 126, an organic compound layer 130, an anode layer 131 and a fifth inorganic insulation layer 132 are formed as shown in FIG. 31B. The shape of the section of this second organic insulation layer 180 has an effect of mitigating stress (especially, a region where the wiring 123, the fourth inorganic insulation layer 129 and the cathode layer 126 overlap), which makes it possible to prevent the light emitting element from deteriorating from this end section. That is, this construction can prevent the progressive deterioration which begins from the peripheral of the pixel then expands to other region. In other words, a region not emitting light cannot expand.

FIG. 32A shows an example wherein the second organic insulation layer 181 is formed with a photosensitive positive-type acrylic resin instead of the photosensitive negative-type acrylic resin. In this case, the shape of the section at the end is different. The curvature radius R3 is 0.2 to 2, with its center located below the wiring 123. After formation of the second organic insulation layer 181, a fourth inorganic insulation layer 129, a cathode layer 126, an organic compound layer 130, an anode layer 131 and fifth inorganic insulation layer 132 are formed along the inclined surface having curvatures as shown in FIG. 32B. The similar effect can be obtained by this construction.

This embodiment can be implemented in combination with the embodiments 1 and 2.

Embodiment 4

For the embodiments 1 to 3, there is no restriction on the construction of the organic compound layer in the light emitting element 309, so that, any known construction is applicable. The organic compound layer 130 has a light emitting layer, a positive holes injecting layer, an electrons injecting layer, a positive holes transferring layer and an electrons transferring layer, and may have a construction wherein these layers are laminated, or a construction wherein a part or all of the materials forming these layers are mixed. Particularly, the light emitting layer, the positive holes injecting layer, the electrons injecting layer, the positive holes transferring layer and the electrons transferring layer are included. An basic EL element has a construction wherein an anode, a light emitting layer, a cathode are laminated in this order. Other possible construction includes a construction wherein the layers are laminated in an order of an anode, a positive holes injection layer, a light emitting layer and a cathode, or an order of an anode, a positive holes injecting layer, a light emitting layer, an electrons transferring layer and a cathode form the top.

Typically, the light emitting layer is formed using organic compound. However, it may be formed with charge injection transferring material including organic compound or inorganic compound and a light emitting material, it may contain one or more layers made of organic compound selected from low molecular organic compounds, middle molecular organic compounds, and polymer organic compounds, and the light emitting layer may be combined with inorganic compound of an electrons injection transferring type or a positive holes injection transferring type. The middle molecular organic compounds refer to organic compounds which are not sublimatic and have molecular numbers of 20 or less, or length of catenated molecules does not exceed 10 μm.

The applicable light emitting materials include metal complex such as tris-8-quinolinolatoaluminum complex or bis(benzoquinolinolato)beryllium complex as low molecular organic compounds, phenylanthracene derivative, tetraaryldiamine derivative and distyrylbenzen derivative. Using one of the above material as a host substance, coumarin derivative, DCM, quinacridone and rubrene may be applied. Other known materials may be applicable as well. Polymer organic compounds include polyparaphenylenevinylenes, polyparaphenylens, polythiophenes and polyfluorenes, including, poly (p-phenylene vinylene): (PPV), poly (2,5-dialkoxy-1,4-phenylene vinylene):(RO-PPV), poly [2-2'-ethylhexoxy]-5-methoxy-1,4-phenylenevinylene]: (MEH-PPV), poly [2-(dialkoxyphenyl)-1,4,-phenylene vinylene]:(ROPh-PPV), poly (p-phenylene):(PPP), poly(2,5-dialkoxy-1,4-phenylene): (RO-PPP), poly(2,5-dihexoxy-1,4-phenylene)), polythiophene:(PT), poly(3-alkylthiophene):(PAT), poly(3-hexylthiophene):(PHT), poly(3-cyclohexylthiophene):(PCHT), poly(3-cyclohexyl-4-methylthiophene):(PCHMT), poly(3,4-dicyclohexylthiophene):(PDCHT), poly[3-(4-octylphenyl)-thiophene]:(POPT), poly[3-(4-octylphenyl)-2,2-bithiophene]):(PTOPT), polyfluorene:(PF), poly(9,9-dialkylfluorene):(PDAF), poly(9,9-dioctylfluorene):(PDOF).

Inorganic compounds, such as diamond-like carbon (DLC), Si, Ge and oxides and nitrides thereof, may be used for the charge injection transferring layer. The above materials may furthermore be added with P, B or N appropriately. Also, the charge injection transferring layer may be oxides, nitrides or fluorides of alkali metals or alkali earth metals, or compounds or alloys of the alkali metals or alkali earth metals with at least Zn, Sn, V, Ru, Sm and In.

The listed materials are only examples. By using these materials, functional layers such as a positive holes injection transferring layer, a positive holes transferring layer, an electrons injection transferring layer, an electrons transferring layer, a light emitting layer, an electron block layer and a positive holes block layer can be manufactured and laminated appropriately to form a light emitting element. Also, a mixed layer or a mixed connection which combines these layers may be formed, as well. The electroluminescence has two types of light, i.e. a light which is emitted when the state moves back from singlet excited state to the ground state (fluorescence), and a light which is emitted when the state moves back from triplet excited state to the ground state (phosphorescence). The electroluminescence element according to the invention can use either or both of these lights.

This embodiment can be implemented in combination with embodiments 1 to 3.

Embodiment 5

The cathode layer 126 and the anode layer 131 of the light emitting element 309 in the embodiment 1 can be reversed. In this case, the layers are laminated in the order of the wiring 123, the anode layer 126, the organic compound layer 130 and the cathode layer 131. Metal nitride (titanium nitride, for example) with a work function of 4 eV or more, as well as ITO may be used for the anode layer 126. The cathode layer 131 is formed from the lithium fluoride layer of 0.5 to 5 nm thickness and aluminum layer of 10 to 30 nm thickness. The aluminum layer is formed as a translucent thin layer so that the light emitted from the organic compound layer 130 is irradiated through the cathode layer 131.

This embodiment can be implemented in combination with the embodiments 1 to 4.

Embodiment 6

Figure 18:
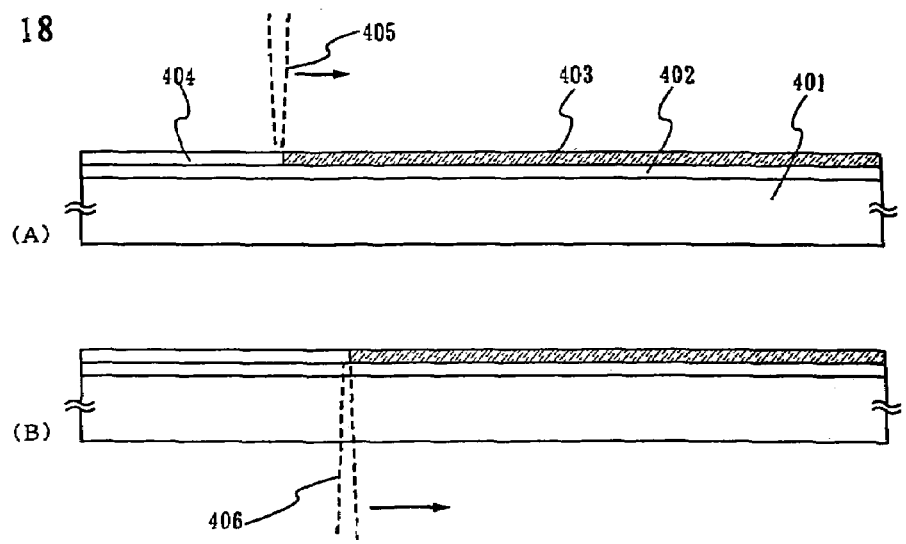
FIG. 18 shows an example of a process to manufacture semiconductor layers to be adopted in the TFT constituting the light emitting apparatus according to the invention.

An embodiment of manufacturing process of the semiconductor layer to be applied to the TFT in the embodiment 1 or 2 will be described with reference to FIG. 18. In this embodiment, continuous oscillating laser beams scan the amorphous silicon film formed on the insulation surface to crystallize the same.

A barrier layer 402 comprising a silicon oxynitride film of 100 nm thickness is formed on a glass substrate 401, as shown in FIG. 18A. On the barrier layer 402, an amorphous silicon film 403 of 54 nm thickness is formed by the plasma CVD method.

The laser beams are continuous beams irradiated with continuous oscillation from a $Nd:YVO_4$ laser oscillator, and the second harmonic (532 nm) obtained by a wavelength conversion element is irradiated. The continuous oscillating laser beams are collected in an oblong shape by an optical system, and by moving relative positions of the substrate 401 the point from which the laser irradiate the beam 405, the amorphous silicon film 403 is crystallized to form a crystalline silicon film 404. F20 cylindrical lens can be adopted as the optical system, which transforms the laser beam with a diameter of 2.5 mm into an oblong shape with long axis of 2.5 mm and short axis of 20 μm on the irradiated surface.

Of course, other laser oscillator may equally be applicable. As a continuous solid-state laser oscillator, a laser oscillator using a crystal such as YAG, $YVO_4$, YLF or $YAlO_3$, doped with Cr, Nd, Er, Ho, Ce, Co, Ti or Tm may be applicable.

When using the second harmonic (532 nm) of the $Nd:YVO_4$ laser oscillator, the laser beam of the wavelength is transmitted through the glass substrate 401 and the barrier layer 402. Therefore, the laser beam 406 may be irradiated from the glass substrate 401 side, as shown in FIG. 18B.

Crystallization proceeds from the area on which the laser beam 405 is irradiated, to form a crystalline silicon film 404. The laser beam may be scanned in either one direction or backwards and forwards. When scanning back wards and forwards, the laser energy density may be changed for each scanning to make gradual crystallization. The scanning may have dehydrogenation effect as well, which is often necessary when an amorphous silicon film is to be crystallized. In that case, the first scanning may be performed at lower energy density, then, after dehydrogenation, the second scanning may be performed at higher energy density to complete the crystallization. Such process can also provide a crystalline semiconductor film in which crystal grains extend in the direction of laser beam scanning. After these processes, semiconductor layers are separated like islands, which can be applied to the embodiment 1.

The construction shown in this embodiment is only exemplary. Other laser oscillator, other optical system and combination thereof maybe applicable as long as similar effect can be obtained.

Embodiment 7

Figure 19:
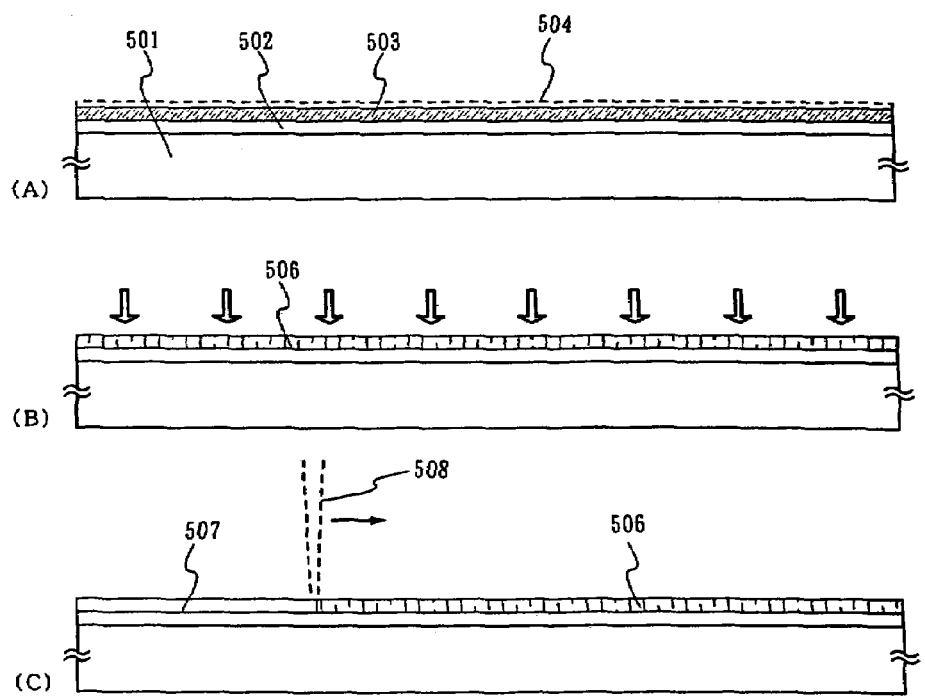
FIG. 19 shows an example of a process to manufacture semiconductor layers to be adopted in the TFT constituting the light emitting apparatus according to the invention.

An embodiment of manufacturing process of the semiconductor layer to be applied to the TFT in the embodiment 1 or 2 will be described with reference to FIG. 19. In this embodiment, an amorphous silicon film formed on the insulation surface is crystallized in advance, then, expanding the size of the crystal grains by continuous oscillating laser beams.

As shown in FIG. 19A, a blocking layer 502 and an amorphous silicon film 503 are formed on a glass substrate 501 as is in the embodiment 1. Nickel acetate 5 ppm solution is spin-coated to form a catalyst element containing layer 504 in order to add Ni as a metal element to lower the crystallization temperature and promote the crystallization.

The amorphous silicon film is crystallized by heating at 580° C. for four hours, as shown in FIG. 19B. Silicide is formed and diffused in the amorphous silicon film by the action of Ni, and the crystal grows simultaneously. The resultant crystalline silicon film 506 consists of bar-shaped or needle-shaped crystals, each of which grows in specific direction when seen from a macroscopic viewpoint, thus the crystalline directions are uniform.

As shown in FIG. 19C, scanning by continuous oscillating laser beam 508 is performed to improve the quality of the crystallization of the crystalline silicon film 506. By irradiating the laser beam, the crystalline silicon film melts and re-crystallize. In this re-crystallization, the crystal grains extend in the scanning direction of the laser beam. It is possible to suppress deposition of crystalline grains with different crystalline grains and formation of dislocations. After these processes, semiconductor layers are separated like islands, which can be applied to the embodiment 1.

Embodiment 8

Figure 20:
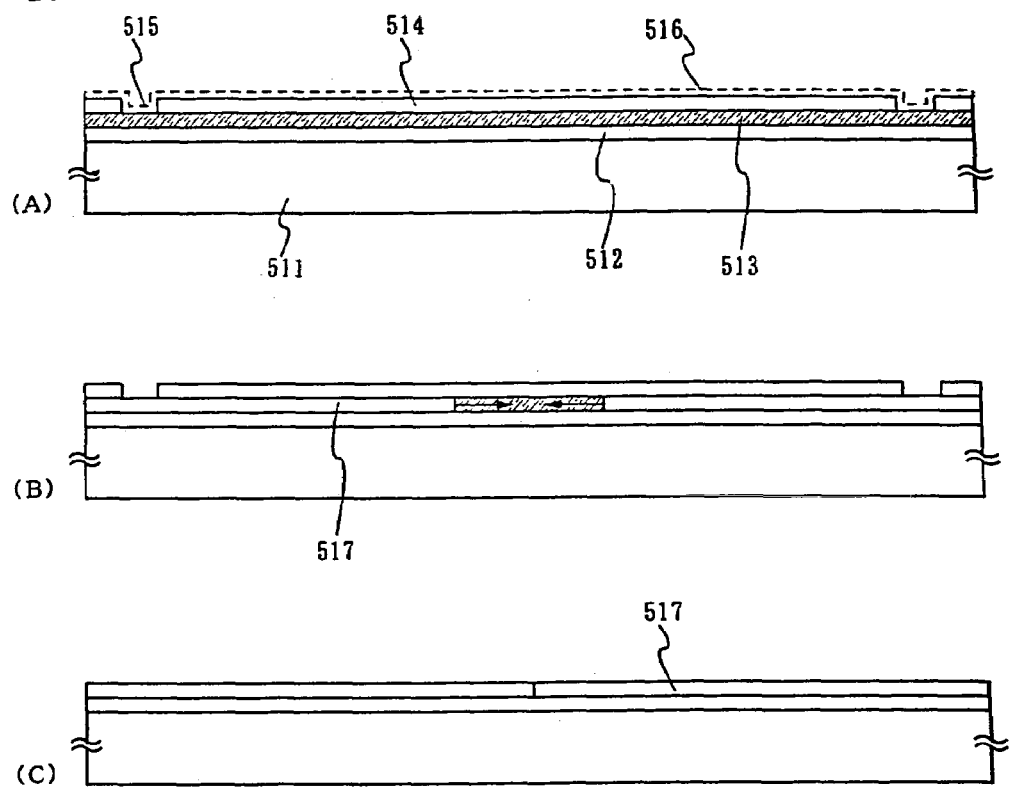
FIGS. 20A to 20C show an example of a process to manufacture semiconductor layers to be adopted in the TFT constituting the light emitting apparatus according to the invention.

An embodiment of manufacturing process of the semiconductor layer which can be applied to the TFT in the embodiment 1 or 2 will be described with reference to FIG. 20.

As shown in FIG. 20A, a blocking layer 512 and an amorphous silicon film 513 are formed on a glass substrate 511 as is in the embodiment 3. On the amorphous silicon film, a silicon oxide film of 100 nm thickness is formed as a mask insulation film 514 by plasma CVD, and an opening 515 is provided. The nickel acetate 5 ppm solution is spin-coated in order to add Ni as a catalyst element. Ni solution contacts with the amorphous silicon film at the opening 515.

Next, as shown in FIG. 20B; the amorphous silicon film is crystallized by heating at 580° C. for four hours. By the action of the catalyst element, the crystal grows from the opening 515 in a direction parallel to the surface of the substrate. The resultant crystalline silicon film 517 consists of bar-shaped or needle-shaped crystals, each of which grows in specific direction when seen from a macroscopic viewpoint, thus the crystalline derections are uniform. Also, it is oriented in a specific direction.

After heating, the mask insulation film 514 is removed by etching to obtain a crystalline silicon film 517 as shown in FIG. 20C. After these processes, semiconductor layers are separated like islands, which can be applied to the embodiment 1.

Embodiment 9

In the embodiment 7 or 8, after the formation of the crystalline silicon film 507 or 517, a process can be added to remove the catalyst element remaining in the film with concentration of $10^{19}$ atoms/cm$^3$ or more, by gettering.

Figure 21:
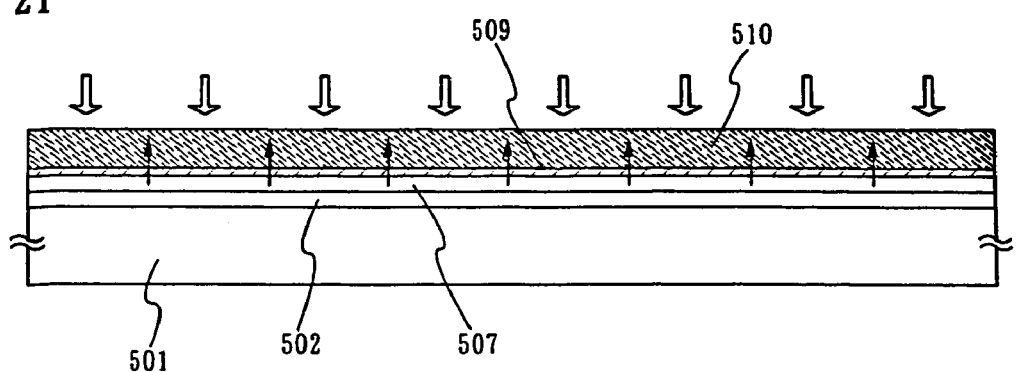
FIG. 21 shows an example of a process to manufacture semiconductor layers to be adopted in the TFT constituting the light emitting apparatus according to the invention.

As shown in FIG. 21, a barrier layer 509 comprising thin silicon oxide film is formed on the crystalline silicon film 507, then an amorphous silicon film added with argon or phosphorous of $1\times10^{20}$ atoms/cm$^3$ to $1\times10^{21}$ atoms/cm$^3$ is formed by the sputtering, as a gettering site 510.

The Ni which is added as a catalyst element can be segregated to the gettering site 510, by heating at 600° C. for 12 hours in a furnace anneal, or by heating at 650 to 800° C. for 30 to 60 minutes with RTA using lamp light or heated gas. This process reduces the concentration of the catalyst element in the crystalline silicon film 507 to $10^{17}$ atoms/cm$^3$ or less.

The gettering under similar condition is effective for the crystalline silicon film formed in the embodiment 2. The minute amount of the metal element contained in the crystalline silicon film formed by irradiating laser beams to the amorphous silicon film can be removed by this gettering.

Embodiment 10

Figure 23A:
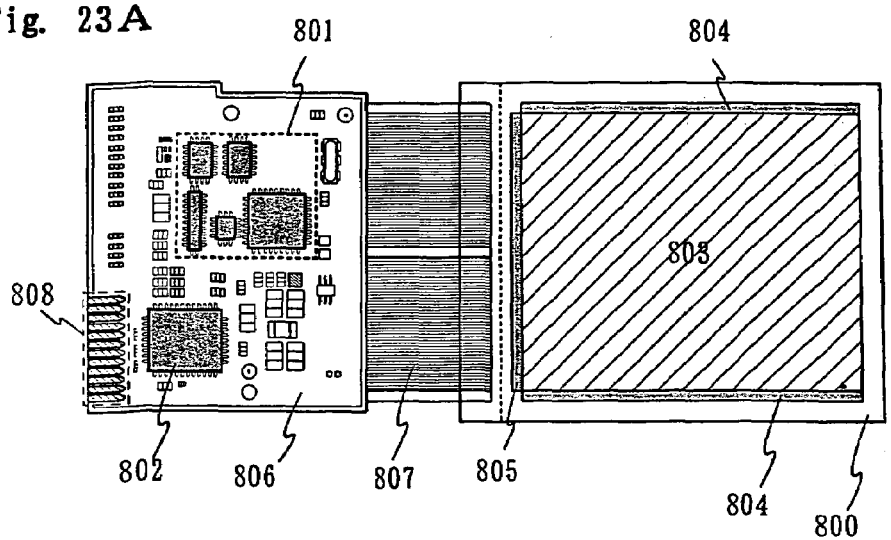
FIGS. 23A and 23B show one construction of the EL module.

FIG. 23 shows an embodiment to make a module from an EL panel in which the pixel section and the driving circuit section are integrally formed on the glass substrate, as shown in the embodiment 1. FIG. 23A illustrates an EL module on which an IC containing a power supply circuit for example is mounted on the EL panel.

In FIG. 23A, the EL panel 800 is provided with a pixel section 803 having a light emitting element for each pixel, a scanning line driving circuit 804 for selecting a pixel in the pixel section 803, and a signal line driving circuit 805 for supplying video signals to the selected pixel. Also, a print substrate 806 is provided with a controller 801 and a power supply circuit 802. Various signals and power supply voltage output from the controller 801 or a power supply circuit 802 are supplied to the pixel section 803, the scanning line driving circuit 804 and the signal line driving circuit 805 of the EL panel 800 via FPC 807.

The power supply voltage and various signals to the print substrate 806 are supplied via an interface (I/F) section 808 on which a plurality of input terminals are disposed. In this embodiment, the print substrate 806 is mounted on the EL panel 800 using FPC, but the invention is not limited to this particular construction. The controller 801 and the power supply circuit 802 may be mounted directly on the EL panel 800 using COG (Chip on Glass) technique. In the print substrate 806, noises may be introduced in the power supply voltage or the signals due to the capacity formed in the wirings or the resistance of the wirings itself, which may prevent sharp rising edge of a signal. In order to avoid this problem, the print substrate 806 may be provided with elements such as a capacitor or a buffer, to prevent noises on the power supply voltage or signals, and to keep sharp rising edge of the signal.

Figure 23B:
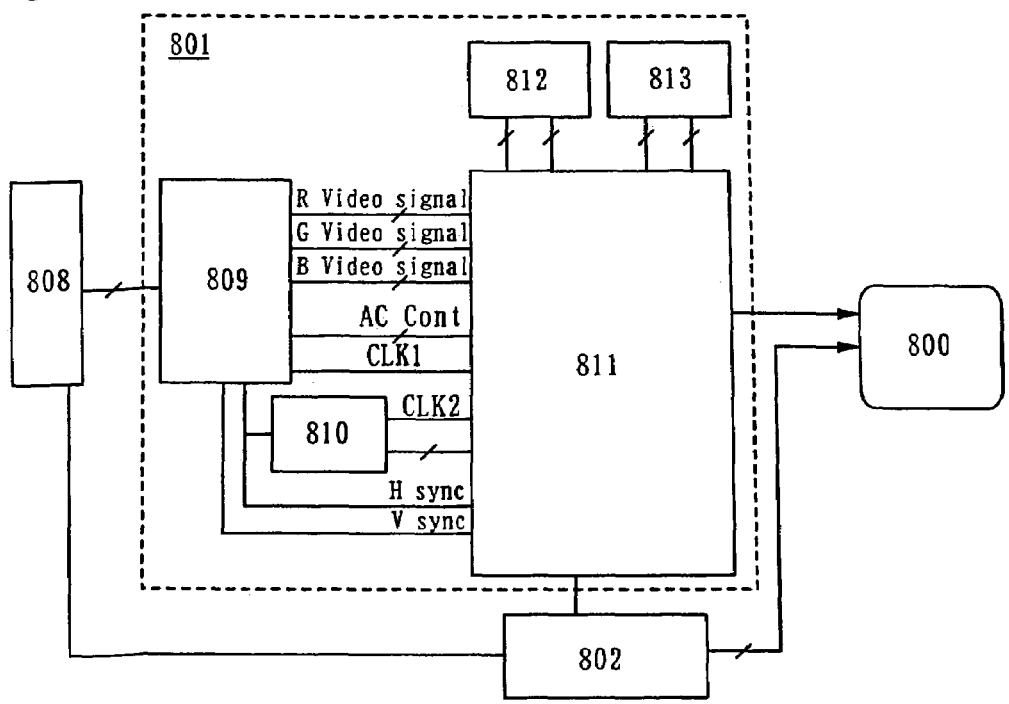

FIG. 23B is a block diagram which shows a construction of the print substrate 806. The various signals and the power supply voltage supplied to the interface 808 are supplied to the controller 801 and the power supply voltage 802. The controller 801 has an A/D converter 809, a PLL (phase locked loop) 810, a control signal generator 811 and SRAMs (Static Random Access Memory) 812 and 813. Although this embodiment uses SRAMs, SDRAMs or DRAMs (Dynamic Random Access Memory, provided that it can read/write data at high speed) may be used as well.

The video signals supplied via the interface 808 are converted from parallel form to serial form by the A/D converter 809, and input into the control signal generator 811, as video signals each of which corresponds to R, G, B colors, respectively. Based on the signals supplied via the interface 808, the A/D converter 809 generates Hsync signals, Vsync signals, clock signal CLKs, and Volts alternating current [VAC], all of which are input into the control signal generator 811.

The phase locked loop 810 is able to make the phases of the frequencies of the various signals supplied via the interface 808 to be matched to that of the operating frequency of the control signal generator 811. The operating frequency of the control signal generator 811 is not always same as the frequency of the various signals supplied via the interface 808, so that the phase locked loop 810 adjusts the operating frequency of the control signal generator 811 to make the frequency synchronized with that of the signals. The video signal which is input into the control signal generator 811 is temporarily written and stored in the SRAMs 812 and 813. From all of the video signal bits stored in the SRAM 812, the control signal generator 811 reads the video signal corresponding to the all pixels by one bit at a time, and supplies the bit to the signal line driving circuit 805 of the EL panel 800.

The control signal generator 811 supplies information related to the period during which the light emitting element emits light for each bit, to the scanning line driving circuit 804 of the EL panel 800. The power supply circuit 802 supplies the predetermined power supply voltage to the signal line driving circuit 805, the scanning line driving circuit 804 and the pixel section 803, of the EL panel 800.

FIG. 22 shows examples of electronic apparatuses in which the above EL module may be incorporated.

Figure 22A:
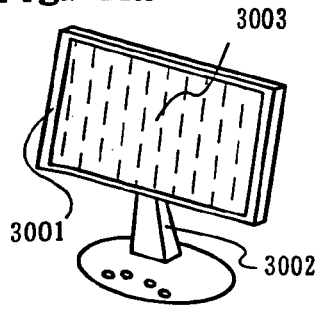
FIGS. 22A to 22G are views which show applications of the invention.

FIG. 22A is an example of a television receiver in which the EL module is incorporated, comprising a casing 3001, a support 3002 and a display unit 3003. The TFT substrate manufactured according to the invention is adopted in the display unit 3003 to complete the television receiver.

Figure 22B:
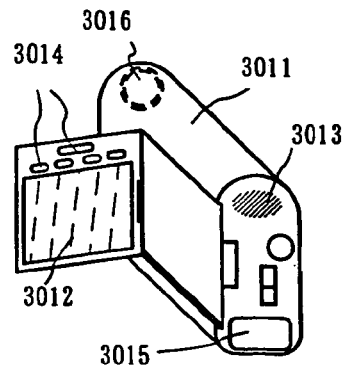

FIG. 22B is an example of a video camera in which the EL module is incorporated, comprising a body 3011, a display unit 3012, a sound input 3013, an operating switch 3014, a battery 3015 and an image receiving section 3016. The TFT substrate manufactured according to the invention is adopted in the display unit 3012 to complete the video camera.

Figure 22C:
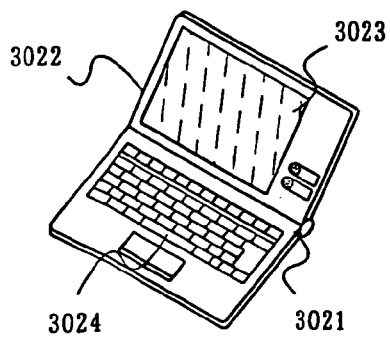

FIG. 22C is an example of a notebook-type personal computer in which the EL module is incorporated, comprising a body 3021, a casing 3022, a display unit 3023 and a keyboard 3024. The TFT substrate manufactured according to the invention is adopted in the display unit 3023 to complete the personal computer.

Figure 22D:
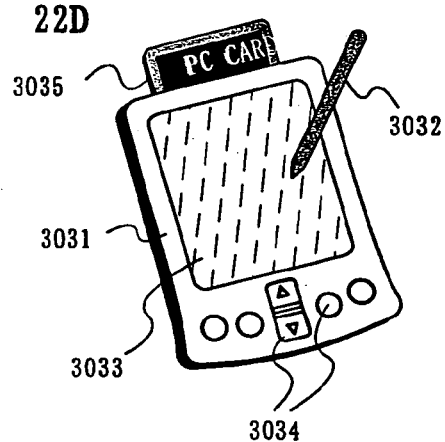

FIG. 22D is an example of PDA (Personal Digital Assistant) in which the EL module is incorporated, comprising a body 3031, a stylus 3032, a display unit 3033, an operating button 3034 and an external interface 3035. The TFT substrate manufactured according to the invention is adopted in the display unit 3033 to complete the PDA.

Figure 22E:
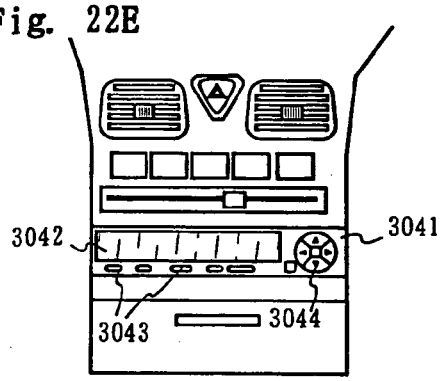

FIG. 22E is an example of an car audio system in which the EL module is incorporated, comprising a body 3041, a display unit 3042 and operating switches 3043 and 3044. The TFT substrate manufactured according to the invention is adopted in the display unit 3042 to complete the car audio system.

Figure 22G:
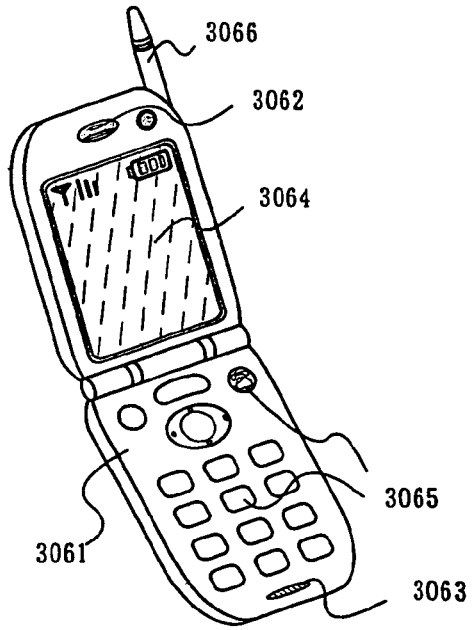
Figure 22F:
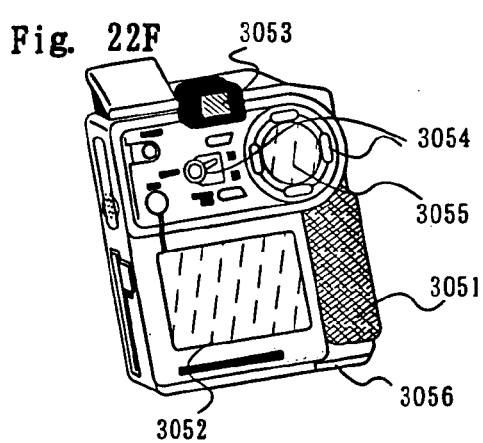

FIG. 22F is an example of a digital camera in which the EL module is incorporated, comprising a body 3051, a display unit (A) 3052, an eyepiece 3053, an operating switch 3054, a display unit (B) 3055 and a battery 3056. The TFT substrates manufactured according to the invention are adopted to the displays (A) 3052 and (B) 3055 to complete the digital camera.

FIG. 22G is an example of a mobile telephone in which the El module is incorporated, comprising a body 3061, a voice output section 3062, a voice input section 3063, a display unit 3064, an operating switch 3065 and an antenna 3066. The TFT substrate manufactured according to the invention is adopted to the display unit 3064 to complete the mobile telephone.

The application of the invention is not limited to the apparatuses shown in this figure. Instead, it can be adopted in a variety of electronics.

According to the invention, the semiconductor film, the gate insulation film and the gate electrode, which are the main components of a TFT, are surrounded by inorganic insulation materials over their upper surfaces and under their lower surfaces to prevent contamination by alkali metals and organic materials. The inorganic insulation material is selected from a group consisting of silicon nitride, silicon oxynitride, aluminum oxynitride, aluminum oxide and aluminum nitride. The organic light emitting element contains alkali metal in its part, and surrounded by inorganic insulation material to realize a construction which can prevent penetration of oxygen or moisture from external world. The inorganic insulation material is selected from a group consisting of silicon nitride, silicon oxynitride, aluminum oxynitride, aluminum oxide, aluminum nitride and DLC. This construction can improve the reliability of the light emitting apparatus.

What is claimed is:

1. A light emitting device comprising:
   a transistor over an insulating surface comprising:
      a semiconductor layer comprising a channel forming region, a source region and a drain region;
      a gate insulation film; and
      a gate electrode;
   a first insulating layer over the transistor;
   a second insulating layer over the first insulating layer;
   a third insulating layer over the second insulating layer;
   a cathode over the first insulating layer and electrically connected to one of the source region and the drain region;
   a light-emitting layer over the cathode;
   an anode over the third insulating layer and the light-emitting layer;
   a seal pattern over the second insulating layer; and
   a sealing plate over the anode and the seal pattern,
   wherein the seal pattern is separated from the anode, and
   wherein the seal pattern does not overlap the light-emitting layer.

2. A light emitting device according to claim 1, wherein the first insulating layer comprises an organic material.

3. A light emitting device according to claim 1, wherein the first insulating layer comprises an inorganic material.

4. A light emitting device according to claim 3, wherein the first insulating layer comprises a material selected from the group consisting of silicon nitride and aluminum nitride.

5. A light emitting device according to claim 1, wherein the second insulating layer comprises an organic material.

6. A light emitting device according to claim 1, wherein the third insulating layer comprises an inorganic material.

7. A light emitting device according to claim 6, wherein the third insulating layer comprises a material selected from the group consisting of silicon nitride and aluminum nitride.

8. A light emitting device according to claim 1, wherein the light-emitting layer comprises an organic material.

9. A light emitting device according to claim 1, further comprising a driving circuit around a pixel region, wherein the transistor is formed in the pixel region.

10. A light emitting device according to claim 9, wherein the seal pattern is overlapped with the driving circuit.

11. A light emitting device according to claim 1, wherein the seal pattern is located over the second insulating layer.

12. A light emitting device comprising:
a transistor over an insulating surface comprising:
    a semiconductor layer comprising a channel forming region, a source region and a drain region;
    a gate insulation film; and
    a gate electrode;
a first insulating layer over the transistor;
a second insulating layer over the first insulating layer;
a third insulating layer over the second insulating layer;
a cathode over the first insulating layer and electrically connected to one of the source region and the drain region;
a light-emitting layer over the cathode;
an anode over the third insulating layer and the light-emitting layer;
a seal pattern in contact with the third insulating layer; and
a sealing plate over the anode and the seal pattern,
wherein the seal pattern is separated from the anode, and
wherein the seal pattern does not overlap the light-emitting layer.

13. A light emitting device according to claim 12, wherein the first insulating layer comprises an organic material.

14. A light emitting device according to claim 12, wherein the first insulating layer comprises an inorganic material.

15. A light emitting device according to claim 14, wherein the first insulating layer comprises a material selected from the group consisting of silicon nitride and aluminum nitride.

16. A light emitting device according to claim 12, wherein the second insulating layer comprises an organic material.

17. A light emitting device according to claim 12, wherein the third insulating layer comprises an inorganic material.

18. A light emitting device according to claim 17, wherein the third insulating layer comprises a material selected from the group consisting of silicon nitride and aluminum nitride.

19. A light emitting device according to claim 12, wherein the light:emitting layer comprises an organic material.

20. A light emitting device according to claim 12, further comprising a driving circuit around a pixel region, wherein the transistor is formed in the pixel region.

21. A light emitting device according to claim 20, wherein the seal pattern is overlapped with the driving circuit.

22. A light emitting device comprising:
a transistor over an insulating surface comprising:
    a semiconductor layer comprising a channel forming region, a source region and a drain region;
    a gate insulation film; and
    a gate electrode;
a first organic insulating layer over the transistor;
a first inorganic insulating layer over the first organic insulating layer;
a second organic insulating layer over the first inorganic insulating layer;
a second inorganic insulating layer over the second organic insulating layer;
a cathode over the first inorganic insulating layer and electrically connected to one of the source region and the drain region;
a light-emitting layer over the cathode;
an anode over the second inorganic insulating layer and the light-emitting layer;
a seal pattern over the insulating surface; and
a sealing plate over the anode and the seal pattern,
wherein the seal pattern is separated from the anode, and
wherein the seal pattern does not overlap the light-emitting layer.

23. A light emitting device according to claim 22, wherein the second inorganic insulating layer comprises a material selected from the group consisting of silicon nitride and aluminum nitride.

24. A light emitting device according to claim 22, wherein the light emitting layer comprises an organic material.

25. A light emitting device according to claim 22, further comprising a driving circuit around a pixel region, wherein the transistor is formed in the pixel region.

26. A light emitting device according to claim 25, wherein the seal pattern is overlapped with the driving circuit.

27. A light emitting device comprising:
a transistor over an insulating surface comprising:
    a semiconductor layer comprising a channel forming region, a source region and a drain region;
    a gate insulation film; and
    a gate electrode;
a first organic insulating layer over the transistor;
a first inorganic insulating layer over the first organic insulating layer;
a second organic insulating layer over the first inorganic insulating layer;
a second inorganic insulating layer over the second organic insulating layer;
a cathode over the first inorganic insulating layer and electrically connected to one of the source region and the drain region;
a light-emitting layer over the cathode;
an anode over the second inorganic insulating layer and the light-emitting layer;
a seal pattern in contact with the second inorganic insulating layer; and
a sealing plate over the anode and the seal pattern,
wherein the seal pattern is separated from the anode, and
wherein the seal pattern does not overlap the light-emitting layer.

28. A light emitting device according to claim 27, wherein the second inorganic insulating layer comprises a material selected from the group consisting of silicon nitride and aluminum nitride.

29. A light emitting device according to claim 27, wherein the light-emitting layer comprises an organic material.

30. A light emitting device according to claim 27, further comprising a driving circuit around a pixel region, wherein the transistor is formed in the pixel region.

31. A light emitting device according to claim 30, wherein the seal pattern is overlapped with the driving circuit.

* * * * *